US010937630B1

(12) United States Patent
Bennett

(10) Patent No.: US 10,937,630 B1
(45) Date of Patent: Mar. 2, 2021

(54) MODULAR PARALLEL ELECTRON LITHOGRAPHY

(71) Applicant: John Bennett, Sammamish, WA (US)

(72) Inventor: John Bennett, Sammamish, WA (US)

( * ) Notice: Subject to any disclaimer, the term of this patent is extended or adjusted under 35 U.S.C. 154(b) by 0 days.

(21) Appl. No.: 16/859,257

(22) Filed: Apr. 27, 2020

(51) Int. Cl.
*H01J 37/317* (2006.01)
*G03F 7/20* (2006.01)
*H01J 37/30* (2006.01)

(52) U.S. Cl.
CPC ...... *H01J 37/3177* (2013.01); *G03F 7/70191* (2013.01); *G03F 7/70375* (2013.01); *G03F 7/70383* (2013.01); *H01J 37/3007* (2013.01); *H01J 37/3175* (2013.01); *H01J 2237/31779* (2013.01)

(58) Field of Classification Search
CPC ............... H01J 37/3177; H01J 37/3175; H01J 2237/31779; H01J 37/3007; G03F 7/70383; G03F 7/70191; G03F 7/70375
USPC ..................................................... 250/492.24
See application file for complete search history.

(56) References Cited

U.S. PATENT DOCUMENTS 4,039,810 A 8/1977 Heritage
5,005,138 A 4/1991 Tobuse et al.
5,395,738 A * 3/1995 Brandes ................ B82Y 10/00 430/296
5,530,482 A 6/1996 Gove et al.
5,677,703 A 10/1997 Bhuva et al.
5,684,360 A 11/1997 Baum et al.
5,691,541 A 11/1997 Ceglio et al.
6,133,986 A 10/2000 Johnson
6,335,783 B1 1/2002 Kruit
6,476,401 B1 11/2002 Veneklasen et al.
6,828,574 B1 * 12/2004 Allen .................... B82Y 10/00 250/492.22
6,841,787 B2 1/2005 Almogy
6,967,711 B2 11/2005 Gui
6,977,375 B2 12/2005 Yin et al.
RE44,908 E 5/2014 Wieland et al.
2003/0122091 A1 * 7/2003 Almogy ................ B82Y 10/00 250/492.24

FOREIGN PATENT DOCUMENTS

WO 2018155537 A1 8/2018

* cited by examiner

*Primary Examiner* — Kiet T Nguyen
(74) *Attorney, Agent, or Firm* — Davis Wright Tremaine LLP

(57) ABSTRACT

Systems and methods are described herein for electron-beam lithography. In some aspects, a photo electron emitter and channel array assembly (PEECAA) may include a photo-electron emitting cathode having a uniform planar surface and an array of beam channels proximate to the cathode. In some cases, at least one of the cathode or the array of beam channels is removable from the PEECAA. The array of beam channels may include a grid of apertures, a plurality of beam channels, and a shared lens array including a plurality of lenses proximate to an exit of the plurality of beam channels. Individual apertures of the grid of apertures align with individual beam channels to allow electrons from the cathode to pass through the array of beam channels and the shared lens array to form a pixelated pattern, such that, upon exposure to the target, the pixelated pattern is permanently formed on the target.

26 Claims, 11 Drawing Sheets

100 104 102 106 108 110 112 114 116 118 120

200 202 204 206 208 210 212 214 216 218 220 222 224 226

900

MODULAR PARALLEL ELECTRON LITHOGRAPHY

BACKGROUND

Lithography is a technology for the creation of patterns on the surface of materials. It begins with covering a target surface with a material layer known as a "resist". The resist will be transformed by a patterned exposure to energy such as visible light, ultra-violet, or electrons which make a chemical or structural transformation of the resist following the exposure pattern. This change is exploited chemically or physically to enable the underlying object to be differently processed according to the pattern of the changes in the resist. Lithography based on such exposure and processing has become the basic technology in forming modern integrated circuitry as well as other nanometer scale devices including pattern masks, accelerometers, chemical processing devices, surface textures and images, gyroscopes, antennas, micromirrors, other micro electro-mechanical systems (MEMS).

Lithography typically uses light as the exposure mechanism but electron beams also can deliver energy to change resists. Electrons can expose patterns with finer detail than light because their wavelength is much shorter (around 1/100th of a nanometer). However, electron beams over long distances of centimeters or more can expose areas only slowly since the electrons repel each other if the beam is intense. The practical rate at which area that can be exposed by single beams is too small for volume production. The mutual repulsion limits also apply if multiple beams operate side by side. Current use of electron beam lithography uses—long beam paths and is used typically only for specialized applications where exposure times of many hours are acceptable. Electron beam sources can be vulnerable to contamination from the target, which may rapidly spoil a source which is exposed to that contamination. Short distances (sub-centimeter) from source to target have been impractical for that reason. In addition, downtime for planned and unplanned maintenance present serious problems in lithography.

Photo-cathodes of the Negative Electron Affinity (NEA) class are widely used for their high efficiency. They use an atomic layer of cesium on the surface to lower the energy needed for electron escape. The cesium sublimates over time, reducing the performance of the cathode, which not just affects efficiency but may also happen at different rates across the cathode, causing the pattern to become unreliable.

As lithography systems reach the 10 nm resolution range, it becomes challenging to overcome the random variations in number of photons delivered, or the "stochastics" problem. EUV systems, for example, deliver around 3,000 photons per 10 nm square of which typically 10% or less will interact with the resist (EUV is soft X-ray, and may penetrate 10 times deeper than the thickness of the resist). Lithography for electronic devices typically requires at least 6 sigma of reliability, which in this case will be +−100 photons. These numbers are worse for edges which are defined by just a fraction of the photons. Long-path electron beams also have stochastic problems, because they use electrons of 5,000 to 50,000 V, which is 50 to 500 times more energy than EUV photons. They need to deliver more energy to ensure the statistical variation is controlled, and that exacerbates how slowly they must run.

BRIEF DESCRIPTION OF THE DRAWINGS

Various techniques will be described with reference to the drawings, in which.

DETAILED DESCRIPTION

Figure 1:
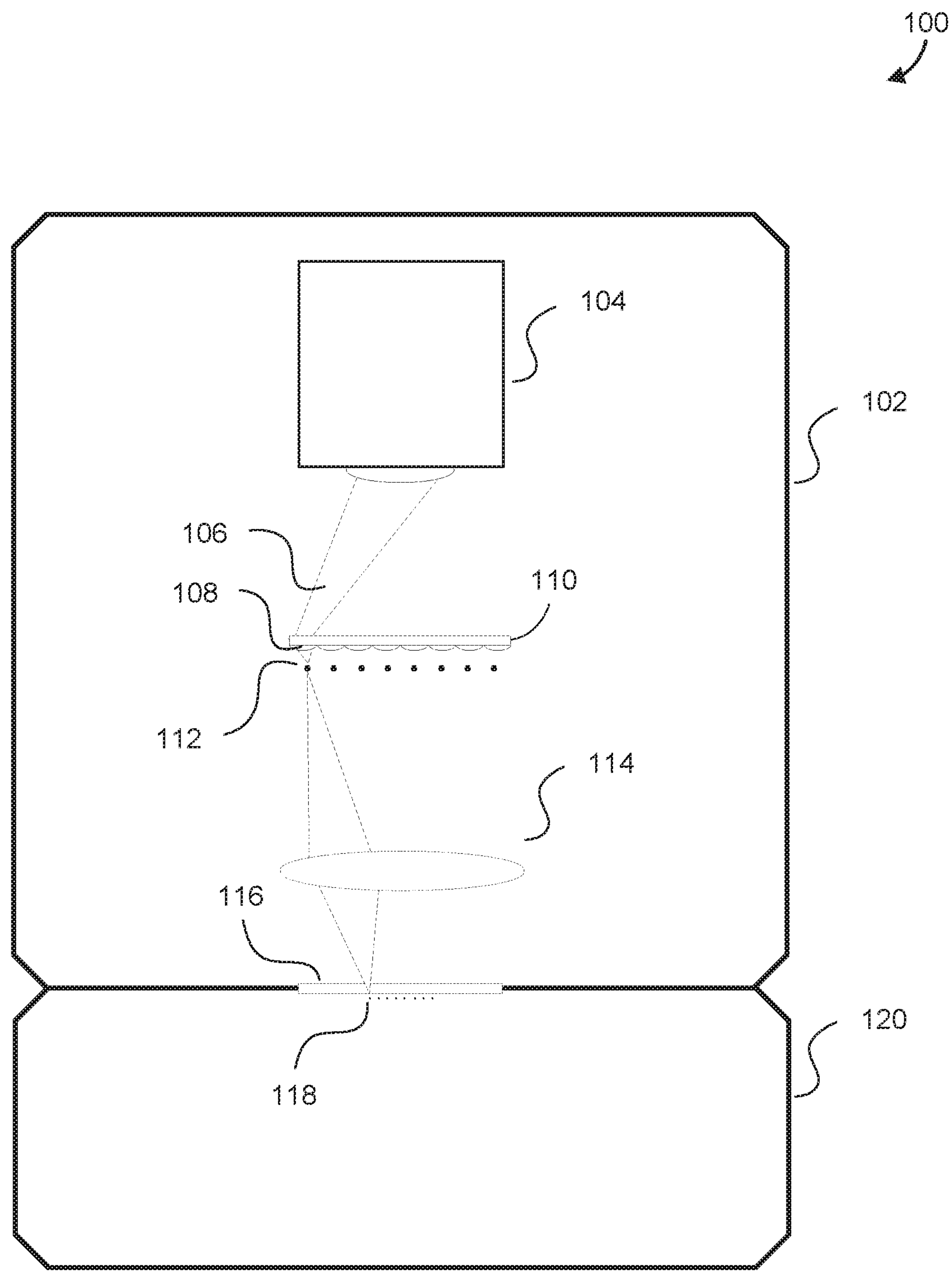
FIG. 1 illustrates an example lithography system, in accordance with at least one embodiment.

Systems and methods are described herein for generating, modulating, and shaping a plurality of fine, microscopic electron beams each with nanometer-scale beam focus, to be used in various lithography processes. The described systems and techniques enable high throughput through parallel operation with minimal interference between beams. Such sources of controlled, precise multiple beams may have various uses. In some aspects, multiple beams may be individually modulated to create a pattern which is projected in proximity, onto a surface proximate to the source of the electrons, or they may be projected at a distance through a lensing system. Targets for the electron patterns include surfaces which react with the electrons to undergo chemical or structural change. Such surfaces may incorporate physical or chemical "resist" designed to be further processed to amplify and fix the changes into surface masks used to control further processing of a material below the resist. In other cases, the electron bombardment may produce a durable change in the target surface which is the direct final patterned product.

In some aspects, a modular parallel electron multi-beam source is constructed using a spatial light modulator, which provides an array of light pixels each modulated in intensity. An optical system concentrates the light of each pixel at its center. These concentrated points are focused upon a photoelectric cathode creating an array of electron sources which respond in intensity to the modulation. The electrons of each pixel enter an electron lens through an aperture mechanism which ensures the small size and geometric accuracy of the electron source. The aperture mechanism may additionally isolate the photoelectric cathode from contamination. Electrons leaving each aperture enter an electron lens. A separate electron lens is provided for every aperture. The individual electron paths and lenses may be shielded from neighbors to eliminate crosstalk and dispersion effects. The electrons exiting the lens may provide a reduce size image of the aperture upon a target material, achieving exposure of a pattern controlled ultimately by the spatial light modulation and the movement of the target relative to the lenses.

Prior approaches to electron beam lithography have never been successful as a means of production due to a combination of practical problems. The techniques and systems described herein innovate to solve one or more of the problems identified above, including contamination, finite lifetimes of photocathodes, temperature control, dimensional stability, accurate reproduction in manufacture, elimination of device defects before use in production, alignment, repeatability, high throughput, and ease of maintenance. Key sub-assemblies are designed to be replaceable while rapidly resuming use with nanometer scale reproducible results. These innovations make this lithography approach practical.

As one skilled in the art will appreciate in light of this disclosure, certain embodiments may be capable of achieving certain advantages, in addressing one or more of the problems identified throughout this disclosure, including some or all of the following advantages and improvements.

Electron beam sources can be vulnerable to contamination from the target, which may rapidly spoil a source which is exposed to that contamination. Short distances (sub-centimeter) from source to target have previously been impractical for that reason. In some aspects, the described systems and techniques innovate in multiple ways which combine to make short path systems practical. Short paths below a millimeter enable scaling up to millions of parallel beams. The beams have an extremely small short time of flight and thus minimize mutual interference. Short beams can run with high intensity and fast exposures.

Photo-cathodes of the Negative Electron Affinity (NEA) class are widely used for their high efficiency. They commonly use an atomic layer of cesium on the surface to lower the energy needed for electron escape. The cesium sublimates reducing the performance of the cathode, which not just affects efficiency but may also happen at different rates across the cathode, causing the pattern to become unreliable. In some aspects, the described systems and techniques combine several compatible methods to reduce the rate of cesium loss.

Downtime for planned and unplanned maintenance can present serious problems in lithography. In some aspects, the described systems and techniques use modular, uniformly replaceable parts which are designed to be quickly swapped and then accurately adjusted to match a reference for position and alignment. The design of these components matches available methods of precision, repeatable manufacture at modest costs. In some aspects, the described systems and techniques also introduce modules which may be refurbished to remove contamination and restore uniformity, and then be recycled into production.

The electron beams in the described systems and techniques may be modulated by varying the light falling in pixel patterns upon the photoelectric cathode. Means are provided for adjusting signal strength delivered to pixels to tolerate declines and local variations in cathode efficiency. A very high rate of modulation is required to keep up with the rate of exposure. The described systems and techniques include ways to multiply the pixel modulation rate delivered by the projection system.

As lithography systems reach the 10 nm resolution range a large problem is overcoming the random variations in number of photons delivered, the "stochastics" problem. EUV systems, for example, deliver around 3,000 photons per 10 nm square of which typically 10% or less will interact with the resist (EUV is soft X-ray, and may penetrate 10 times deeper than the thickness of the resist). Lithography for electronic devices needs at least 6 sigma of reliability, which in this case will be +−100 photons. The numbers are worse for edges which are defined by just a fraction of the photons. Long electron beams also have stochastic problems, because they use electrons of 5,000 to 50,000 V, which is 50 to 500 times more energy than EUV photons. They need to deliver more energy to ensure the statistical variation is controlled, and that exacerbates how slowly they must run. In some aspects, the described systems and techniques can deliver on target much more energy than EUV and can use electrons below 500V. The number of electrons interacting with the resist will, in some cases, be high enough to control statistical variations even at sizes below 10 nm squares. Electrons below 50V will be almost completely absorbed in the resist, and are effective agents in the desired changes to resists already in use for optical and extreme ultra-violet lithography. Future resists may be further specialized and optimized for low voltage electron beams, for example by improving conductivity to avoid local buildup of charge which may deflect the beams, or for example inclusion of anisotropic structure preferring electron flow perpendicular to the surface.

In the preceding and following description, various techniques are described. For purposes of explanation, specific configurations and details are set forth in order to provide a thorough understanding of possible ways of implementing the techniques. However, it will also be apparent that the techniques described below may be practiced in different configurations without the specific details. Furthermore, well-known features may be omitted or simplified to avoid obscuring the techniques being described.

System Overview

The systems and techniques described herein may enable sustained production of patterns of electrons which may be controlled and projected with tiny focus at low voltage over short distances. In some aspects, the described systems and techniques may utilize a rear-illuminated photoelectric emitter cathode, which is an epitaxial surface on a transparent substrate. For example, gallium arsenide (GaAs) or gallium nitride (GaN) crystal surfaces implanted with a gradient of a hole-donor atom (a p-doped gradient directs free electrons towards the surface), which can function as an electron-emitting photocathode, may be used. The GaAs or GaN may itself be an epitaxial layer on a compatible transparent substrate such as quartz or sapphire which have the strength, stability, and transparency desired for a durable substrate. Many ways of preparing such a surface are known and in use, and may be utilized in the described systems and techniques, as high quality flat GaAs and GaN epitaxial layers are already used to produce a wide variety of electronic devices. In some cases, the surface may be doped to produce a conductive profile. A p-doped profile with magnesium implantation is one example of surface preparation for an efficient and durable photo-emitting cathode. The surface may also be treated with atomic layers of cesium, optionally combined with similar traces of oxygen, which increase the photo-emission efficiency. This surface may advantageously be made to be uniform across its whole area. In some examples, rear illuminated cathode surfaces with more than 10% quantum efficiency of emission may be used.

A removable Photo Electron Emitter and Channel Array Assembly (PEECAA) may also be utilized the described system to provide a number of advantages and benefits, as will be described throughout the disclosure. The optical chamber may contain measuring instruments which monitor key parameters. The window between the projector chamber and the vacuum chamber containing the PEECAA would normally be transparent to a wide range of wavelengths, dimensionally stable, and a shape with known optical properties. The window, PEECAA, and other elements may incorporate reference markings. For example, instruments may be focused upon the PEECAA and other elements to ensure that the PEECAA is accurately positioned. Instruments may additionally or alternatively be used to monitor temperatures including PEECAA and window temperatures. Similarly, instruments may also be used to observe the alignment of the pixel image projected upon the PEECAA and other optical elements. Instruments may sample light scattered off the individual pixels to monitor that the patterns are being correctly modulated. Monitoring may be continuous and used to predict required maintenance or report actual faults, in addition to providing feedback for correct alignment and other operational adjustments.

Lifetime of these surfaces may be extended by operating them colder than room temperature. Cooling in this way has been shown to extend the operating life of surfaces with Cesium (Cs) activation as reducing temperature reduces sublimation from the surface. Temperatures may be controlled throughout both the optical and vacuum chambers, as will be described in greater detail below.

The surface may be further protected from contamination by isolation behind an electron-transparent pellicle, which blocks contaminating atoms from reaching the photocathode. One realization of this is a germanium grid structure supporting a graphene layer. High quality graphene is grown on the germanium and the germanium is then etched away to leave a grid which matches the intended pixel size and spacing. Alternatively, a pellicle may be separately made and then transferred onto a separately prepared grid structure. The grid and pellicle are placed against the photocathode with the pellicle elevated by the grid standing off from the photocathode surface. The pellicle will pass a fraction of low voltage electrons from the photocathode surface, while acting as a durable and non-reactive barrier to prevent molecular contaminants from reaching the photocathode. The pellicle will be heated by the fraction of electrons it blocks and this will recycle cesium back to the photocathode. In some cases, other "2D" materials, such as hexagonal boron nitride, will also work as pellicles which allow transmission of electrons at optimal low voltages while blocking atomic or molecular transfers, and those other materials may best be grown on different substrates than graphene, or transferred to grid structures made of other materials in which the grid structure can be prepared.

In some cases, the grid may be doped to be conductive on the side closest to the photocathode, so that as the grid rests upon the photoconductive surface it may provide an additional path for current to be distributed across the photocathode surface. A conductive initial section to the channel may also provide trajectory shaping for electrons in the proximity of the cathode, steering them perpendicular to the cathode and closer to the center of the aperture. In some cases, the aperture and pellicle may be energized with a few volts positive relative to the cathode, creating a voltage gradient between the photocathode and the aperture to clear electrons efficiently from the photocathode and to give them the energy to pass through the pellicle.

The number of electrons available is a function of modulated light with the correct color (photon energy exceeding the work function energy of the photocathode surface projected upon the photocathode. This is focused by the projector optics to a small dot located aligned with the centers of the grid apertures. Electrons traverse these small dimensions in nanoseconds or less under the influence of even a single volt scale field at the aperture, which supports submicrosecond flashes and modulation of the projectors. Electrons passing through the aperture and pellicle are injected into the array of channels which are aligned to the apertures perpendicular to the cathode, beyond the apertures and aperture pellicle.

In some cases, the active electron emission positions on the photocathode will be locations which are spaced well apart from each other. For example, one possible implementation would use UV light focused through the cathode substrate onto grid centers spaced about 10 micrometers apart from each other. This spacing may simplify the projection optics to optimize for small focal points with high contrast modulation and separation from adjacent pixels. The pixel grid is aligned so each focal point is at the center of a cell of the grid. The apertures define the centers of that same grid. Electrons from the illuminated spot will spread out by the time they reach the aperture, which thus selects a subset and sets their shape (there might be square, circular, or elliptical apertures, for example). Accuracy upon the target requires the apertures to be aligned relative to the lens elements in the channel, correcting for lesser accuracy of the optical spots or the grid walls. The apertures can be machined repeatably for construction of the channel array and verified by inspection and testing before an array is accepted for production use. In some cases, multiple accuracy grades may be obtained, useful for different resolutions of lithography which might be more relaxed in some layers of a product. This concentration of the critical dimensions into the aperture array and beam channels is important and provides repeatability and replaceability of parts or all of the PEECAA while maintaining uptime.

The photocathode array may similarly be inspected for uniformity at point of manufacture, rejecting or reworking those which show defects, so that replacement parts in production may be trusted not to interfere with accuracy and reproducibility of results. The separation and centering of the illumination spots within the grid is important to obtain contrast between neighbors, and to obtain a consistent level of electrons entering every channel for a standard level of illumination.

The lighting can be any wavelength short enough to generate photoelectrons from the cathode surface. UV wavelengths are short and have an advantage in allowing the illumination points to be focused at smaller size than visible light. The wavelength is, preferably, only slightly more energetic than the threshold energy (work function) of the photocathode material, since electrons with small excess energies will be more easily focused to an even smaller point on the target. An efficient photocathode material such as GaN with a cutoff around 365 nm in the UV-A range may be beneficial, in particular as it would support focal points of 100 nm or smaller. The focal plane and active area of the photocathode is interior to a material with a high refractive index, which reduces the effective wavelength and allows for smaller focus with back illumination.

Some examples of a structured light modulator may use light projected through an array of pivoting mirrors, such as in a Texas Instruments DLP™ system, while others may use an array of individually switched nano-LEDs. Such systems may provide millions of independently modulated light sources, which when projected onto the photocathode surface, generate a similar number of modulated electron beams. When the photocathode and the LED are based upon the same emission chemistry, for example, both work with GaN nominally at 365 nm energy for both LED effect and electron emission from the cathode surface, efficiency can be improved by cooling the source LED to be colder than the photocathode. This shifts it to shorter wavelength and higher photon energy, so it more efficiently converts photons to emitted electrons at the photocathode surface while not leaving too much excess energy in the free electrons.

At extremely small operational tolerances of the described systems and techniques, it is beneficial to maintain a constant temperature. In order to avoid varying temperature due to patterns, the projector may use a second color for the non-emitting pixels. This color would be selected to have a lower photon energy than needed to stimulate electron emission, but delivering an equivalent thermal energy to the photocathode as occurs in the regions of emission where electrical losses add on top of the optical power. Every or substantially every pixel would receive the same thermal input whether it is photo emitting or not, thus keeping the photocathode and the elements near it at a constant energy budget regardless of the pattern. The overall system can then supply uniform cooling and heat flow to keep the operating elements at a constant temperature so that thermal changes do not distort or displace the image.

GaN is of particular interest as a well understood and successful material for high durability and efficiency photodiodes and lasers light sources. Both cathode and source operate nominally at 365 nm. If the source is held colder than the cathode, then the source wavelength will become relatively shorter with higher photon energy than the cathode threshold, ensuring that photoemission is efficient. In some cases, different photocathode surfaces and source colors may be used. Many photocathode surfaces are known, each with their own color range, efficiency, uniformity, and durability.

The modulated electron beams may exit each pixel through the aperture and optional pellicle and enter a distinct micro-column of the channel array which will accelerate and focus the beam originating from that grid element. The accelerated electrons will exit the opposite end of the micro-column with trajectories which focus at the target at some distance beyond the end of the micro-columns. In some cases, the channel may include an additional pellicle layer across the channel at any point up to and including the exit of the channel, which allows a useful fraction of electrons to pass with acceptable loss of focus, while limiting entrance of contaminants into the channel.

The substrate assembly including the photocathode, substrate, grid and micro-column array (the PEECAA) may be designed to be separable from the rest of the lithographic machine or system. The PEECAA in turn may include an enclosure into which the photocathode and its substrate can be inserted and removed in some designs more frequently and easily than replacement of the whole PEECAA. The photocathode and substrate are placed so that electrical contacts are completed and the photocathode surface is reliably and repeatably located at the focal plane of the projection system where the modulated illumination points shall be in focus on the cathode active surface. By the described design, insertion and removal of the photocathode and substrate shall be possible with a minimum of abrasion. The photocathode substrate may include guiding features in their shape, such as handles to aid automated removal and insertion.

The micro-channel array may be arranged adjacent to the photocathode, either at a short distance or in contact. In the example where the microchannels are in contact with the photocathode during operation, there may be included a mechanism to remove the microchannels off the photocathode before removal, and to regain contact after insertion. These mechanisms may include clamping movement in the support structure, or electrostatic or magnetic attraction across the width of the surfaces.

The micro-channel array may come to a similar and undistorted position when a photocathode is replaced so that the microchannels shall accurately and repeatably project electrons to their intended position on the target. This may be assisted by fine positional adjustment elements in its mounting structures, by exact control of temperature, by timing of the voltage differences which bring the surfaces together, and/or by instrumental feedback which guides the positioning and the timing of the closure when the components are aligned.

In some aspects, the substrate and photocathode and its support structures are designed with transparency and shape allowing for the alignment of the microchannel array relative to the target to be measured precisely even while the photocathode is in place and operating. Such optical means for monitoring and measuring the position of the micro-channel array may be used to adjust the microchannel array position relative to the target. The observation of the micro-channel array relative to the target may also be used to vary the timing of pattern projection to keep it in synch with the movement of the target, and to control and correct the movement of the target as it glides evenly past the micro-channel array in precise alignment.

In some cases, the target and micro-channel array are held in parallel planes so that the target will move in a precise linear motion while the array is very slightly rotated in the same plane so that one, two, or some other integral number of micro-columns will trace out each precise line of a raster pattern on the target. The use of a tilt with one micro-column per line may maximize throughput while requiring the array to be perfect, while the use of two or more elements tracing the same line (with the same modulation timed to match the target) may be slower but provides redundancy that compensates for imperfect micro-columns. In one example, if a microchannel array which has 2 million elements in an array 20 millimeters wide, then the sweep with a single channel per raster line will permit a focus as fine as 10 nm wide to be used. If the tilt brings 2 micro-channels onto each trace, then the rasters may be 20 nm wide, and with 4 micro-channels on each trace then 40 nm wide. Double or quadruple pixels allow more energy to be delivered, redundantly, but with either larger resolution or a smaller overall width. A rotation of dual pass on that device could also trace 10 nm wide spots at 20 nm spacing, resulting in separated lines drawn by the raster.

FIG. 1 illustrates an example lithography system 100 including an array of photo-emitters. System 100 illustrates the general arrangement of the lithography machinery in at least one embodiment, showing the relationship of the pattern-modulating optical projector, the intermediate optical system bringing the pixel pattern to bear on the photocathodes which feed the beam channels, and their situation in general into two chambers, one for the optics and one for the electron beams and targets, the latter of which must be a vacuum chamber. In the example illustrated, chamber or component 102 is a part of system 100 that containing a modulated light source 104 and the optical path. Chamber 102 may be separated from the vacuum chamber 120 in which electron beams are operating. The modulated light source 104 projects an array of pixels individually modulated to change many times per second forming different patterns. Pixel beams 106, generated by modulated light source 104, are projected onto a single element lens 108 on an intermediate focal plane 110. A lens per element 108 at the intermediate focal plane 110 concentrates the pixel to a point source widely separated from its neighbors and centered within the pixel. The output of the single element lenses 108 on the intermediate focal plane 110 may produce an array of concentrated points 112, which include the modulated image for the remaining optics.

A reduction lens 114 focuses the concentrated points onto a target plane 116. In some cases, the target plane may include the photo emitter cathode 118 which sources the electron beams. In yet some cases, the target plane 116 may additionally or alternatively include a transparent rigid window, which may be used to separate the optical chamber 102 from the vacuum chamber 120. In some cases, the surface of the photo emitter cathode 118 may be held in position at the focus of the reduction lens where the modulated image will source points of electron emission.

The electron beams and target may be contained inside a vacuum chamber 120 along with machinery to align and service the beams and align, move, and service the target. Targets may be moved to allow individual beams to scan a raster line, so that every beam draws a separate raster and the whole area of the target will be covered by the rasters.

Aspects of system 100 have been proposed starting in the early 1990's, but never successfully implemented. The problems of slow operation, rapid contamination, and precision went unsolved, and the approach was abandoned within a decade. Modern electron lithography machines do exist, used for mask preparation and for prototyping, but they operate on different principles using long electron paths.

The described systems and techniques return to this approach but innovate to address one or more problems, indicated above, while retaining the promise of the original concept, as will be described in greater detail below. These innovations include changes at various stages from the structured light modulator through to the channel array. Various stages or components of a lithographic system will be described below. It should be understood that various aspects of these stages or components may in combination, and in and of themselves, both define improvements over existing systems and techniques.

Figure 2:
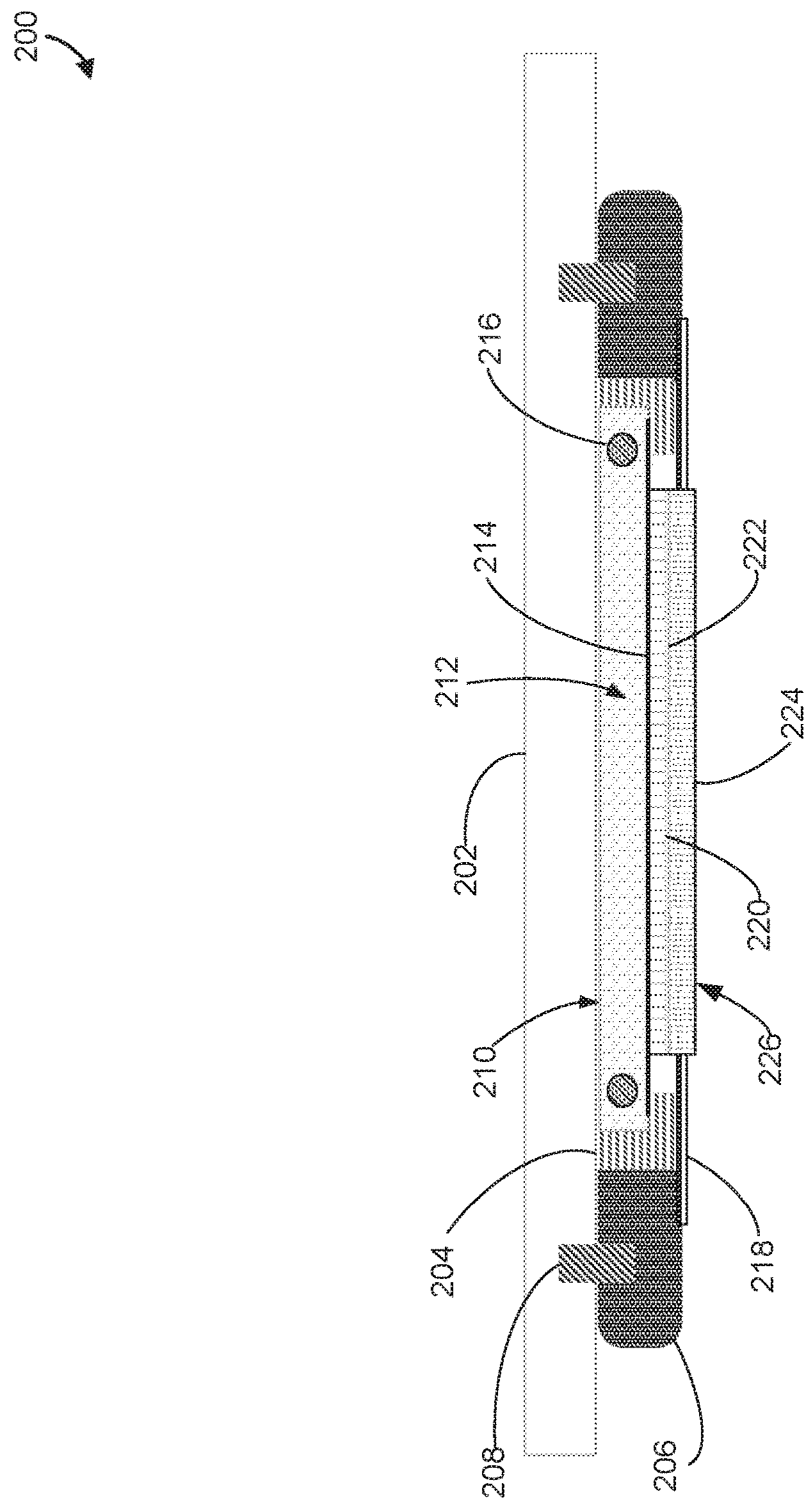
FIG. 2 illustrates an example of a replaceable cathode and photo emitter assembly, in accordance with at least one embodiment.

FIG. 2 illustrates an example of a replaceable or modular cathode and photo emitter assembly 200. In one example, assembly 200 may be a Photo Electron Emitter and Channel Array Assembly (PEECAA). In the example illustrated, PEECAA 200 is a whole or modular device which may be removed and swapped in production when maintenance is needed. It should be appreciated that various elements of PEECAA 200 may in their turn be removed, refurbished, or replaced independently.

In the example illustrated, assembly 200 may include support structures, such as an optical window 202, a photocathode mount 204, q channel assembly mount 206, and an anchor 208, which serve as the mechanical shell and carrier for the various other parts of the PEECAA 200. The PEECAA 200 may be removable placed in the vacuum chamber, such as vacuum chamber 120 of system 100, within the optical path so that the spatially modulated light pattern is focused onto the photocathode surface 212 of the photocathode module 210, which may include a photocathode substrate 212, a photocathode surface 214, and/or a handle 216. The PEECAA 200, when installed, may be located at the final focus for the optical projection path, with the projection system accurately controlled to maintain the focal plane at the photocathode surface 214. The apparatus may have a window 202 separating the optical projector from the vacuum chamber so that the PEECAA 200 may be mounted and removed adjacent to that window 202 while the vacuum and non-vacuum sections, such as chambers 102 and 120 of system 100, remain isolated. A lithographic system, such as system 100, may be configured to place the chamber 102 in physical contact with that window 202 for thermal cooling and mechanical stability. Anchor elements 208 may lock and release the PEECAA 200 allowing it to be removed and replaced at the optical window 202 of a lithographic system, such as system 100. Handle or handles 216 may be provided on the photocathode substrate 212 to aid in removal and insertion into the PEECAA 200 without disturbing other elements.

As illustrated, the PEECAA 200 is designed for rear illumination. The window 202 at back of the assembly 200 (top as illustrated) will be transparent to the colors of light in use by the projector. The window 202/back of the assembly 200 may be made or include a material such as quartz which is mechanically strong, has low thermal coefficient of expansion, and is transparent across a wide range of colors including the ultraviolet (UV). It should be appreciated, that in other implementations, the PEECAA 200 may be configured for other illumination configurations, where one or more of the components are rearranged, removed, or additional elements added, etc.

In some aspects, the assembly 200 includes a photocathode mount or guide 204 which ensures the photocathode module 210 may be inserted and removed from a lithography system, such as system 100, while kept within tolerances. The guide 204 may also provide connections between the photocathode module 210 and electrical sources. The guide 204 may also include some ability or adjustment to bring the transparent substrate 212 close to, or further away from, the optical window 202. Moving the substrate 212 into contact with the window 202 during operation can eliminate reflections, while also improving thermal conductivity and dimensional stability.

In some aspects, photocathode 210 may be uniform and planar on a plate of substrate, such that the photocathode 210 may be removed or inserted sideways through a slot in the PEECAA 200, within which there is a compartment precisely sized to hold it in operating position. An example of how this would operate begins with a rotating arm manipulator (not drawn), which is inside the vacuum chamber and when idle is kept retracted to one side away from the operation of the projector and target transport. A translation motion would extend the arm to grip the handles or holes in the side of the photocathode plate. The arm would then retract to extract the plate, rotate to align with a staging area where the arm extends so the expired plate can be stacked within an airlock for later removal. The arm then retracts and rotates to a different staging area where fresh plates have been arranged within an airlock, extend and grip the next plate. Retract, rotate back to the PEECAA, extend to insert the fresh plate into the PEECAA, release grip and retract back to its idle position and remain there until next needed. The adjustments within the PEECAA provide loosening of the photocathode plate before the grip removes it, and when the fresh plate is inserted the PEECAA tightens the surrounds and adjusts the new plate to its correct position. The incoming airlock may also include bake-out and cleaning functions to ensure the incoming parts are decontaminated and have fresh surfaces, before being admitted to the functional vacuum chamber. In some cases, the entire PEECAA 200 may be designed to fit into a socket on the window, such that it may be lifted out and a new PEECAA inserted into the same socket. A rotating arm assembly as described for moving photocathode plates is one general approach possible for moving the entire PEECAA between airlocks and operational position.

In some aspects, a microcolumn or channel support 218 is attached to a channel assembly mount 206, which may also be referred to as a microcolumn base, which is part of the supporting assembly, such as to aid in correct placement and alignment of PEECAA 200 within a lithography system, such as system 100.

In some aspects, the PEECAA 200 may be held inside a lithographic machine or system, such as system 100, in a mechanism which can adjust the PEECAA 200 to be aligned with the modulated optical sources. For example, piezoelectric materials in the support 218 may be used to make fine adjustments, for example, in response to varying electrical inputs. In another example, the use of a thermal control system or device may be employed to control the temperature of the support 218 using expansion and contraction to adjust the position and stresses upon the PEECAA 200. Measurement of the correct location of the PEECAA 200 may be done for example by optical inspection of reference structures in key parts of the PEECAA 200 and reference structures in the optical window 202. In some cases, optical markers, physical limiters, other devices, and/or combinations thereof may be used to enable automatic alignment of the PEECAA 200 in a lithographic system. In another example, electrical sensors such as capacitance across a gap, or piezoelectric cantilevers may measure the position of the PEECAA 200 relative to reference points in the support 218.

In some cases, the microcolumn array 220, which may include a number of isolation elements and apertures or electron beam channels, may be designed to be flexible so that tension in the support 218 controls the dimensions of the array 220, while changes in temperature are resolved by opposing changes in tension which maintain the position of electron optics channels 224 of the array 220.

In some implementations, the photocathode module 210 consists of a transparent substrate 212, which may be made of quartz, sapphire or other similar material, upon which a rear-illuminated photoelectric emitter surface 214 such as p-doped gallium nitride, is layered. This module 210 may be constructed to have a highly uniform photo-electron emitter surface and may be replaceable separately within the PEECAA 200, for example, by loosening it from the optical window 202, channel supports 218, and/or from the array/apertures 220 and then removing or inserting sideways through a slot in the side of the PEECAA 200. The supporting structures 202, 204 surround it with clearance, such as minimal clearance, for it to be inserted and removed without abrasion. There may be contoured shapes, such as handles or sockets 216 at the edge of the module 210, which allow for precision mechanisms to securely engage the module 210 when removing or inserting.

In some cases, it is advantageous that the photoelectric emitter surface 214 should remain useful over a long period. Eventually, however, its efficiency or uniformity may be impaired. The design of the PEECAA 200 may make it practical to perform replacements frequently, or as needed. The described PEECAA 200 design may also allow for the use of target chemistries which may balance advantages in resolution and functionality against the rate of contamination. The choices of various materials can be balanced since the photocathode module 210 and/or the entire PEECAA 200 may be swapped at acceptable cost and minimal interruption to operation.

In some aspect, the photoelectric surface 214 may be uniform and smooth so that when it is inserted into the assembly 200, the horizontal positioning is not critical. The modulated light source may focus to form pixels using any part of the uniform photo-electron emitter surface layer 214. The precision of pixel placement is provided by the exact engineering of the micro-column array 220 and careful alignment of the projector. The uniform photocathode 210 is thus replaceable without disturbing the alignment.

In the example illustrated, the photocathode 210 cannot be an insulator as it sources a small but important and continuing electric current. There are choices of photocathode materials which are not insulators, for example p-doped GaN. In addition, the microcolumn array 226, which may include apertures 220, pellicle 222, and electron optics channels 224, may have a conductive layer adjacent to, and in contact with, the photocathode 210 as part of the isolation and aperture first stage of every microcolumn. This both helps shape the electron field inside the first stage of the column and will distribute current efficiently and uniformly to every active part of the photocathode surface 214.

The described microcolumn array 226 is held in a support 218 which provides dimensional and locational stability. Accurate location may be ensured by sensing systems, including remote optical sensing from within the projection compartment. Such sensing may combine reference markers in the chamber, in the PEECAA 200, and in targets, to continually monitor alignment both during initial start-up when the PEECAA 200 elements are first positioned, and during operation to ensure that temperature and other factors are not causing alignments to be lost.

A combination of movement in the supports 204, 206, 218 and shape of the microcolumn array 226 may allow the photocathode elements 212, 214 to be brought adjacent to, or to be separated from, the optical window 202 and the isolation and apertures 220. The surfaces which contact may use materials and surface preparations on both which do not stick to each other. In some cases, the contact allows for the photocathode module 210 to provide structural support for the microcolumn array 226 and for the microcolumn array 226 to assist in distributing electric current to the photocathode surface 214 during operation. Separation when not in operation allows the photocathode 210 to be removable. In this case, the contact and separation of the photocathode 210 from the microcolumn array 226 will be uniform and repeatable without damage.

In some aspects, when the electrons exit the photocathode surface 214, they are accelerated by an electric field beyond the photocathode 210, towards a parallel barrier layer a few microns in front of the photocathode surface 214. The field may be shaped by choice of materials and shapes in the supporting structure, such as structure 218, which forms a grid surrounding the pixels and serves to support the barrier layer. The barrier is charged at a small positive voltage relative to the cathode 210 and has an aperture, such as one of apertures 220, in front of the pixel, which serves as the narrow and controlled entrance to the rest of the electron beam channel. The supporting structure 218 between cathode and barrier may have materials and voltages chosen to steer the emitted electrons toward the aperture. The aperture may be covered by a pellicle 222, which is largely transparent to electrons with energy from the low voltage at the aperture. The pellicle 222 may be a durable film of material such as graphene, hexagonal boron nitride, or molybdenum disulfide, in some examples. Although other materials may be used. These may be present in single, double, or other low count atomic thicknesses to provide transparency at ideal electron-volt energies which match the energy of electrons passing through the apertures. The pellicle 222 may provide a barrier isolating the photocathode 210 from contaminants which may come from other parts of the device or from the target. The pellicle 222 may also slow the loss of cesium from the photocathode 210. Traces of cesium are used in high efficiency photoelectric cathodes and evaporation of cesium over time is a major cause for declining efficiency. The pellicle 222 may run hot due to impacts from a fraction of the electrons and cause cesium to recycle to the cooler cathode 210.

In some cases, the apertures 220 are precisely manufactured to be aligned to the following beam column and lens. The aperture 220 is the image source which the lens projects and the photocathode 210 serves to illuminate it with electrons from behind, pulsing on or off according to the pixel modulation. Accurate fabrication of this aperture 220 uniformly central to the axis of each column and lens is important to the uniformity of the image projected by the lens array. The aperture 220 may be shaped in order to create a more ideal exposure pixel, for example it may be circular, or it might be square or oval, depending upon the kind of pattern that will be fabricated. It is possible to have different styles available optimized for different stages in a production line.

After passing through the aperture, 220 the electrons will be accelerated down the axis of the column or micro column array 226 by increasingly positive voltages applied to the column as the distance along the column increases. The column may be constructed with a sequence of insulating, resistive, and conductive walls, as will be described in greater detail below in reference to FIGS. 3, 6, and 7. These layers may be deposited broadly and evenly across the blank form of the array, and then the channels of the columns are masked and etched at precise intervals in an array layout, through these layers. The different materials appear as annular elements in sequence along the column.

The electron beam column 226 further accelerates the electrons up to and through a lens, which focuses the beam onto a target beyond the end of the column. There is an array of columns operating in parallel, fed by the grid of modulated, illuminated pixels. The array of columns 226 is uniform in geometry and uses identical electron lenses and voltages for all channels. As such, there may be no need for independent per-channel control or switching of the lenses. The channels and lenses are manufactured to be uniform in size, spacing, and to use voltages which are constant during operation. This uniformity enhances precision of beam placement on a target, such that the beams will be accurate relative to each other and to the overall array. The geometry, channel length, and choice of voltages controls magnification or reduction of aperture and distance to the focal plane beyond the end of columns.

In some aspects, one construction includes a 100 nm rounded-corner square as the source aperture, and the beam column would include a 5× reduction lens. The column would then project a 20 nm rounded square as a pixel shape upon the target beyond the column. If the distance from the aperture to the lens is X microns, then the focal plane for the target in this example would be (X/5) microns beyond the lens.

The accuracy of drawing is decided by alignment of the aperture to the lens, and the uniform spacing of the columns relative to each other. The array 226 may be manufactured using very precise lithography that should be capable of nanometer-scale uniformity and repeatability. Exact masks will outline the patterns for the channels, which may be etched precisely in one or more steps guided by these masks. This may be coupled with meticulous inspection and testing to ensure the beam array is fit for use in production. Characterization of the part may allow for some kinds of variation, for example if the etching step which forms the lenses is a few nm offset from the etching of the apertures, but this offset has a uniform and predictable effect upon target alignment, then the part may be accepted along with the calibration information that allows it to be operated with compensation for the alignment shift. Each array 226 may then be monitored during production and if it goes out of spec it may be swapped out for a precisely matched replacement.

When parts fail, the errors detected may be analyzed for root cause which feed back into process improvements, so the mature production will have a sufficient ratio of defect-free components to be economical. When the PEECAA 200 or array 226 are installed or replaced, there may be calibration marks in the machine which allow it to be adjusted for exactly repeatable fit. The adjustments may include temperature, positioning, and the tension holding it.

When the photocathode module (PEECAA) 200 is removed and replaced, the removed PEECAA 200 may be refurbished several times before true end of life. The photocathode surface 214 may be cleaned (for example by prolonged baking, including in the presence of cleaning agents such as atomic hydrogen) followed by a reapplication of trace cesium. The photocathode 210 may be inspected for uniformity, and any deviations repaired, reworked, or the part may be scrapped if it cannot meet requirements. This strict approach simplifies replacements and ensures best results in production. The pellicle 222 and rest of the PEECAA 200 may also be refurbished several times, if constructed of materials durable enough to go through a bake-out and cleaning cycle in vacuum to remove contamination. Once all the elements are renewed the PEECAA 200 may be reassembled, tested for reliability and accurate alignment, new calibrations recorded for adjusting alignment in the projector, then shipped back to be installed in a machine. In some cases, automated recycling will make the photocathode 210 and array 226 modules more economical. In some cases, precise and comprehensive testing allows selection of only the photocathodes 210 and PEECAA 200 assemblies which meet 100% correctness. This strict selection is compatible with the highly accurate and repeatable micro-fabrication technologies available today. It will lower yield but simplify lithographic operation when all beams can be certified capable of correct operation.

In some cases, replaceable modules also allow machines to be fitted with different geometries for flexibility in production lines. For example, there may be alternative modules with square, circular, elliptical, or rectangular entrance apertures to the columns which produce pixel images optimized for different purposes, and there may be channels optimized for different depths of focus or different ratios of electron beam coverage compared to space between raster beams.

In many cases, the photocathode will inevitably decline in efficiency. It can be cooled to prolong its working life but typically the surface is activated by Cesium which will migrate eventually, and some contamination may find its way through. The efficiency of photo-emission may be monitored using periodic test calibration patterns onto an instrumented target capable of measuring the electrons emitted from individual columns of the array. When the photoelectron emitter array is first installed and ready for use, an initial calibration can be used to modify the intensity of illumination or modulation to achieve an accurate and uniform quantity of electrons delivered to the target. A structured light modulator, such as a liquid crystal array in the optical path, may be used allowing each pixel to be adjusted, independently of the SLM used for pattern information. Periodic repeats of the calibration can be used to keep the modulation adjusted. The calibration process also allows the replacement of the photocathode module to be predicted and scheduled.

Figure 3:
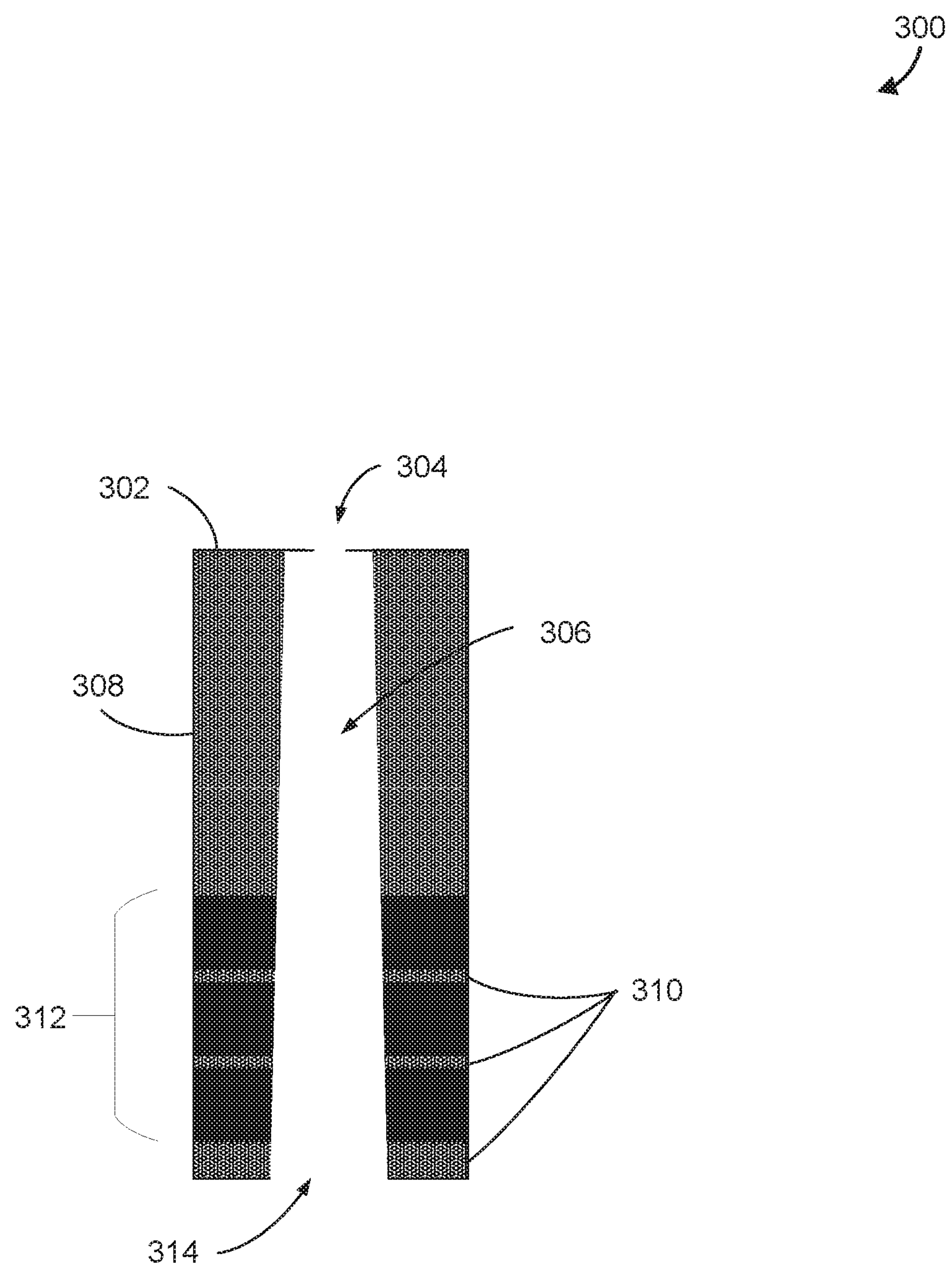
FIG. 3 illustrates an example of an electron beam channel and electron lens assembly in accordance with at least one embodiment.

FIG. 3 illustrates an example of an electron beam channel and lens assembly 300 in accordance with at least one embodiment. In some aspects electron beam channel 300 may be an example of an individual electron beam channel 220 described above in reference to FIG. 2.

An individual electron beam channel and lens assembly 300 includes an entrance shield 302, which contains an entrance aperture 304 that limits the effective width and defines the shape of the electron beam entering the beam channel 306. The beam channel 306 is formed by structural support 308, which should be of sufficiently high electrical resistance to avoid creating a difficult power drain on the lens, but conductive enough to isolate electrons in the channel 306 from displacement by what current might be flowing in neighboring channels. At intervals in the channel 306, conductive layers 310 may be placed around or proximate to the channel 306 (e.g., in place of the support structure 308, which are energized each to its own distinct voltage. The combination of geometry and voltage forms an electron lens 312, which both accelerates the electrons and focuses them as they pass out of the beam exit 314. In some cases the electrostatic lens may be supplemented by using a structural material with high magnetic permeability and maintaining an external magnetic field parallel to the axis of the channels across the beam array and up to the beam target. The magnetic field spreads out from the walls at the end of the channels adding an additional squeeze to the exit beam.

The resistivity of the structural support formed by layers 310 makes the lens calculations slightly different than a classical lens, where the nearby space is assumed to be vacuum or insulator, but this simply requires minor adjustment of the voltages used incorrect design of the electron lens for the new conditions. The benefit provided by layers 310 is that each channel and lens is isolated from neighbors, allowing the assembly to operate at a higher beam density without pattern interference from neighbors.

In some cases, the conductive layers 310 are attached to voltage sources which provide acceleration of the electron beam along the axis of the channel 306, but which also vary in such a way as to create lensing effects. One such configuration is to have three conductive layers 310 across the array which will appear as three electrode rings in the wall of every column's channel 306. These may be used with a high, low, high voltage sequence to act as an Einzel lens. With the correct sizes, locations, and voltages, these can act as a reduction lens projecting a smaller image of the source aperture upon the target. Other lens configurations are possible, for example a second Einzel triplet may be added to obtain a second lens, or other forms of electron lens might have some advantage. A wide variety of electron lenses can be used, and the method of layering then channeling through the layers may be used to create profiles for various electron lensing systems.

The material between the conductors 310 may be insulator, or highly resistive material, and may additionally include conductive layers which are not connected to external circuits. Resistive material has advantages in terms of draining away any surface charges which attach to the channel walls, and of improving isolation between adjacent beams. Conductive layers also improve isolation and improve beam centralization.

Figure 4:
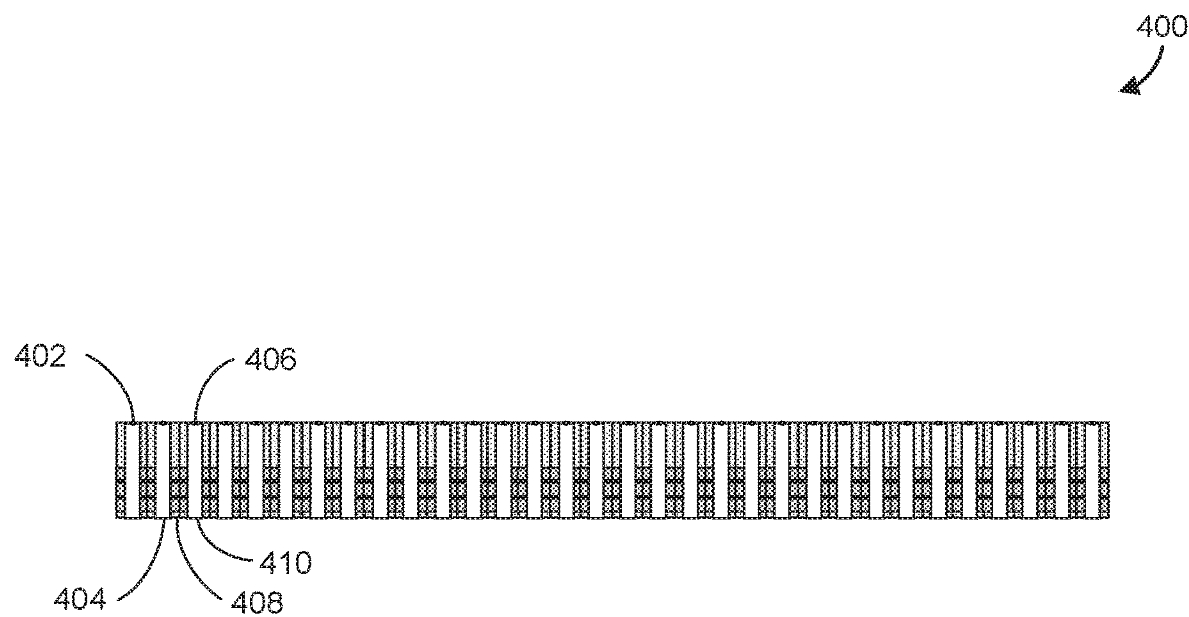
FIG. 4 illustrates example cross-section view of an electron beam channel and lens assembly in accordance with at least one embodiment.
Figure 5:
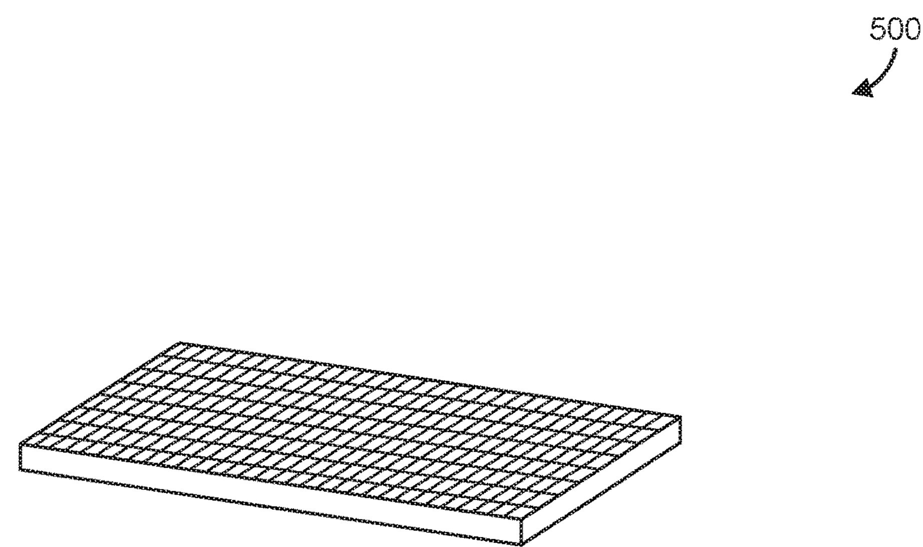
FIG. 5 illustrates an example perspective view of an electron beam channel and lens assembly in accordance with at least one embodiment.

FIGS. 4 and 5 illustrates example views 400 and 500 of an electron beam channel and lens array or assembly in accordance with at least one embodiment. In some examples, electron beam channel array may include a number of electron beam channels 402, 404, 406, etc., which may be an example of or include one or more aspects of electron beam channel 300 described above in reference to FIG. 3. View 400 illustrates a cross-sectional view of an array of X by Y number of channels, and view 500 illustrates a perspective view of an array of X by Y number of channels forming a 2 dimensional shape, such as a rectangle.

The built-in isolation, provided at least in part by layers 310 and the structure of each electron beam channel 300 more generally, enables formation of beam channels in dense arrays sharing walls 408 and lens elements 410 with neighbors, such as in the case of electron beam channels 402, 404, 406, etc. The array, 400 and/or 500, can be formed in a two-dimensional array, as illustrated by view 500, for example by building up a slab with alternate uniform layers of shield 302, support 308, and lens conductor 310, as described above in reference to electron beam channel 300 of FIG. 3, then using a lithographic process to define the locations of the channels and etch them into the slab, creating a whole array with thousands or even millions of adjacent channels. These channels would be located to line up with the modulated points from the projection system, such as system 100 described above in reference to FIG. 1.

Figure 6:
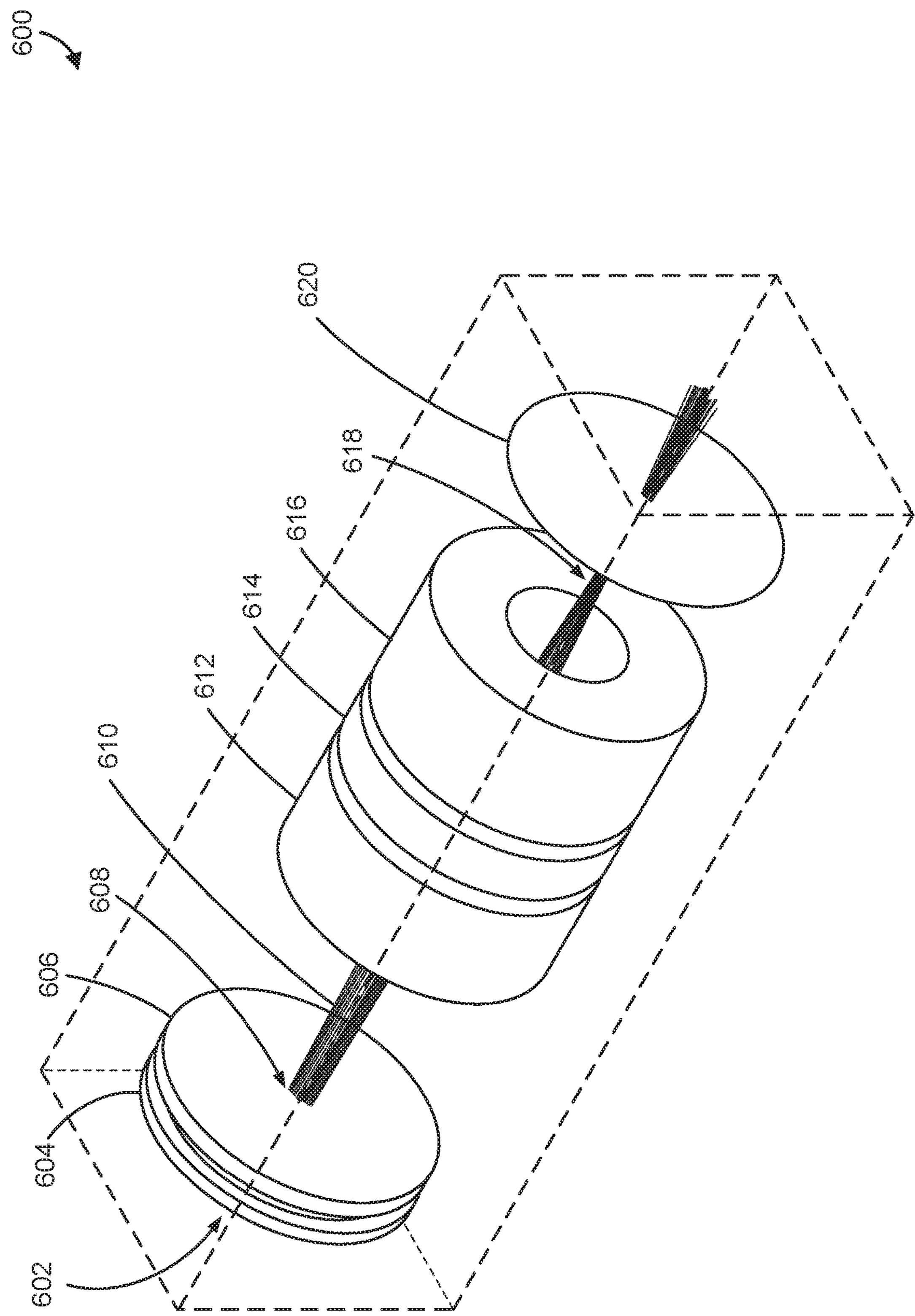
FIG. 6 illustrates an example perspective view of an electron beam channel and electron lens, in accordance with at least one embodiment.
Figure 7:
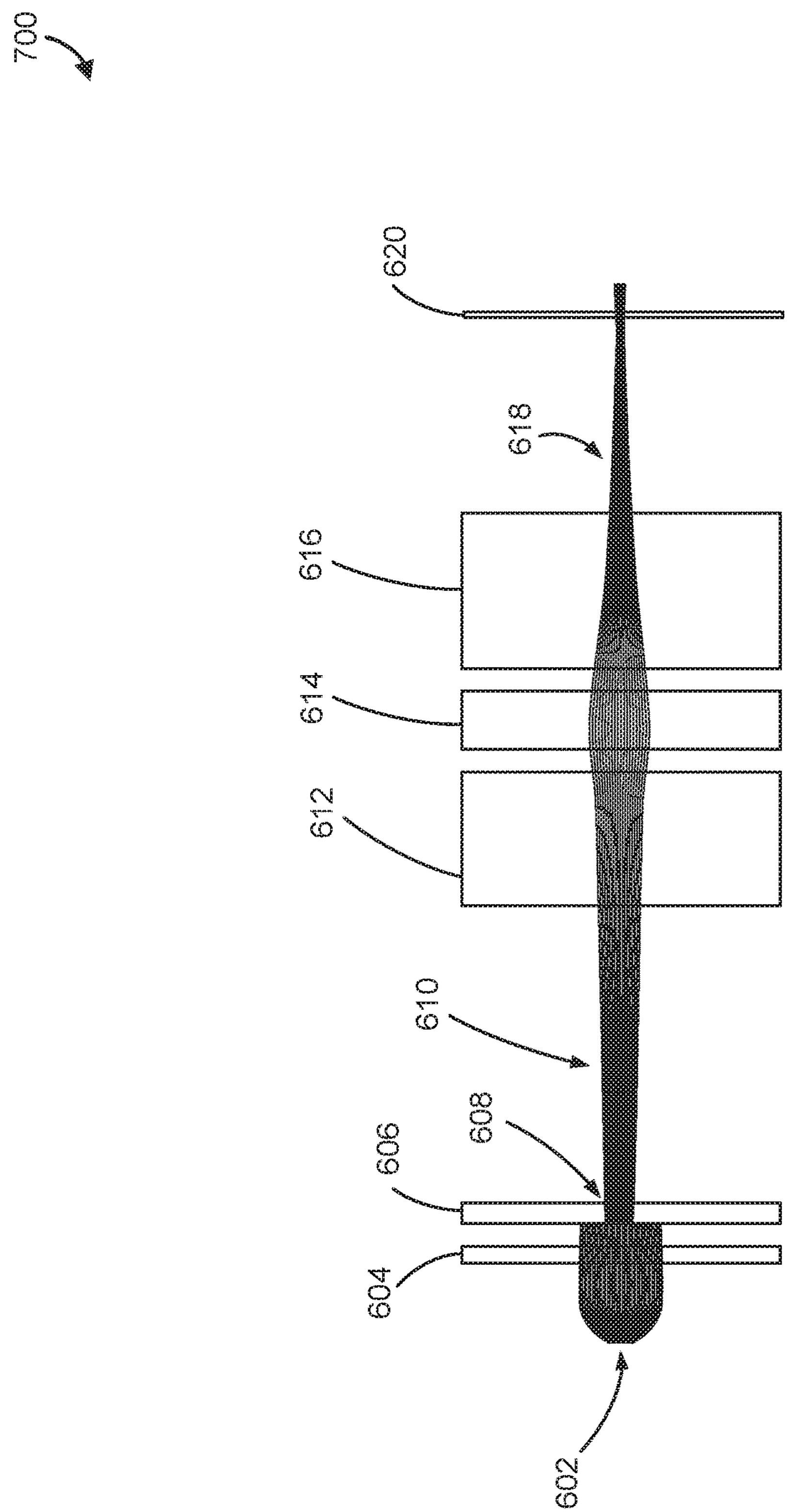
FIG. 7 illustrates an example cross-section view of an electron beam channel and electron lens, in accordance with at least one embodiment.

FIG. 6 illustrates an example perspective view 600 of an electron beam channel and electron lens and FIG. 7 illustrates an example cross-section view 700 of an electron beam channel and electron lens, in accordance with at least one embodiment. In some aspects, views 600 and/or 700 may be examples of electron beam channel 300, and/or may be incorporated into arrays 400, 500 as described above in reference to FIGS. 3-5. For ease of reference, similar components will be referred to using the same reference numbers in the following description of views 600 and 700 of an electron beam channel and electron lens.

In FIGS. 6 and 7, the structure of a channel showing electron optical elements and beam shaping are shown, whereas supporting structures not shown so that active elements are more visible.

When used with a projector system, as described above in reference to FIG. 1, an optical projector may focus a modulated pixel at a point on the surface of the photoelectron cathode 602 from which issue electrons. Beam shaping electrodes 604, which surround the assigned pixel position of photo-cathode 602, draw the electrons away from the cathode 602 and accelerate them toward the entrance barrier 606. The aperture of the barrier may be covered with a low voltage electron-transparent pellicle 608 which allows electrons 610 to flow into the channel while blocking molecular contamination from reaching the photocathode 602. The electrons 610 flow in a beam down the channel on trajectories guided by acceleration towards the more positive voltage on the first lens element 612 of lens elements 612, 614, 616. The lens elements 612, 614, 616 have a geometry and sequence of voltages which focus the exiting electrons at 618 to impinge at a place 620 on the target where they will form a reduced image of the barrier aperture shape 606.

The example illustrated in FIG. 6, in one example, simulates a channel configuration with an Einzel lens having sizes and voltages suitable for use with a million-channel electron lens array.

Figure 8:
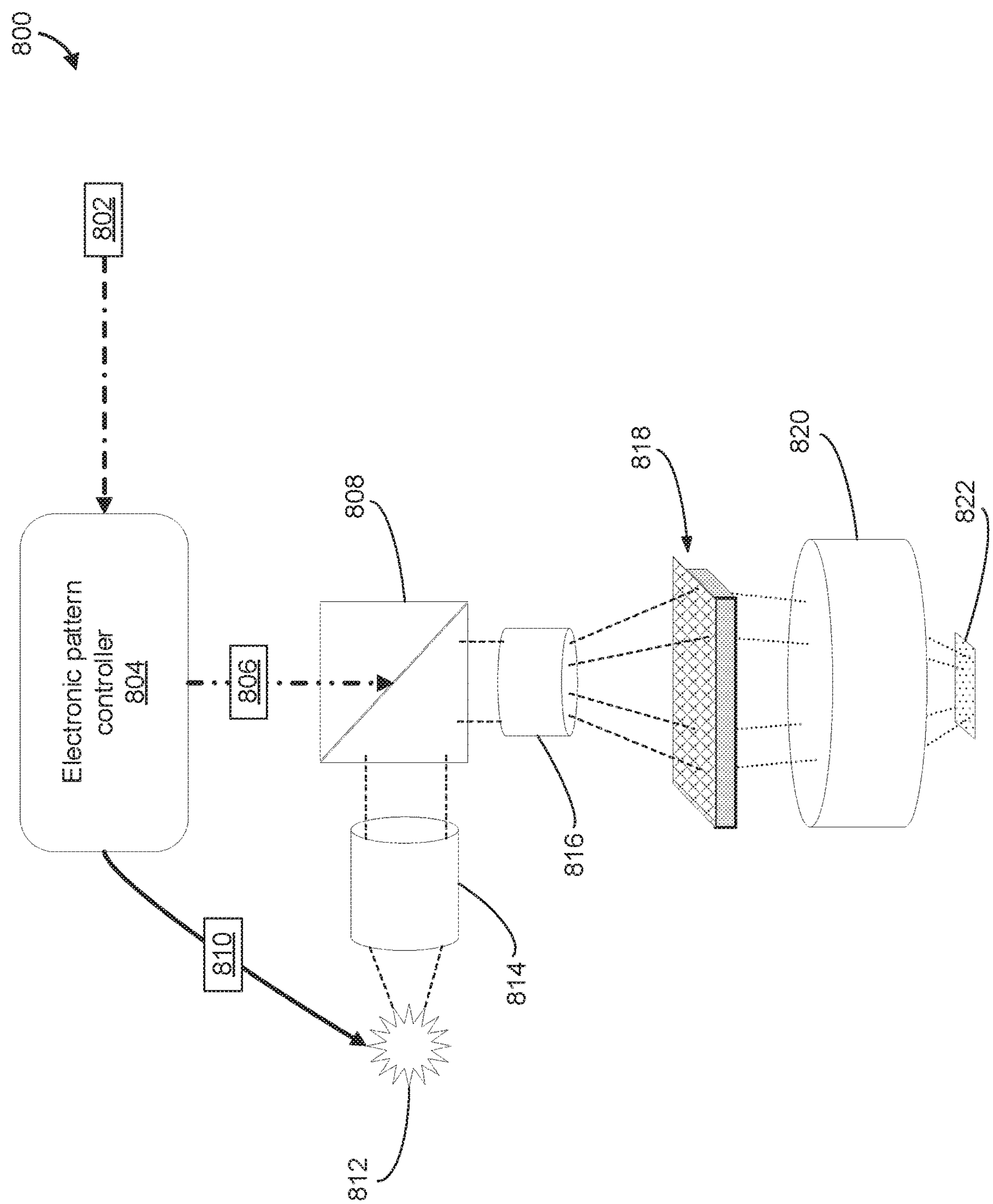
FIG. 8 illustrates an example optical pattern generator and projector system, in accordance with at least one embodiment.

FIG. 8 illustrates an example optical pattern generator and projector system 800, in accordance with at least one embodiment. In some examples, system 800 may be used in conjunction with the PEECAA 200, electron beam channel array 400, 500, and/or a number of electron beam channels 300 as described above, to form a lithographic system that addresses one or more of the problems with existing lithographic systems, as also described above. In some examples, system 800 may be a modulated electron beam projector and may include a sequence of assemblies which result in a parallel array of electron beams each of which is separately modulated by a part of the data, synchronized with all the other beams so that they draw a complete pattern as they trace a raster over the target. The raster may be space filling, or may trace a subset of the target area, as will be described in greater detail below in reference to FIG. 9.

In one example, a pattern to be modulated (e.g., source data 802) is held in digital storage such as DRAM, SSD, or HDD, or other memory technologies as may be used for similar purpose. This source data 802 is accessed on a schedule which ensures it is available to the pattern controller 804 at the time when it is needed for modulation. The data is organized into frames which have a value for every pixel in the electron beam array, and each frame pattern data 806 is transferred to the spatial light modulator (SLM) 808. Any of a variety of multiple known technologies for SLM 808 can be used, such as a Texas Instruments Digital Light Projector (DLP™), an array of LEDs, etc. When the pattern is ready in the SLM, a timing signal 810 is sent to the light source 812, which flashes briefly, and that flash is collimated by light source optics 814 to illuminate the SLM 808. The flash may be brief in order to minimize motion blur on the target as it may be continually moving across the field of the electron beam.

The pattern exiting the SLM 808 is focused by intermediate optics 816 onto an intermediate optical assembly 818, which will concentrate the light of each pixel to a focus at the center of the pixel for improved efficiency, reduced waste heat in the photocathode assembly, and/or reduced crosstalk between neighboring pixels. The intermediate assembly 818 may be implemented, for example, in a fly's-eye panel with a separate condensing lens and other optical corrections implemented for individual or every pixel. The intermediate assembly 818 may include a mechanism such as a liquid crystal array to allow the intensity for each pixel to be adjusted for uniformity and to compensate for changes as the photocathode ages. The concentrated points for each pixel all fall in the input focal surface for final objective optics 820, which reduce the image dimensions and focus upon the plane of the photo-electric cathode 822. Each modulated source element in the pattern thus results in a modulated point of light in a grid pattern on the cathode 822. The optics are designed to ensure that grid is correctly spaced, focused, and sized to be an accurate match to the grid of the electron beam channels.

Various components of system 800 may be optimized for different pixel sizes. For example, when making silicon chips, a pixel size of 10 nm square may be preferred for creating active elements and the finest levels of metal, but then a beam of 20 or 40 nm squares may be preferred for levels of wire with larger wire. A projector or SLM 808 delivering such larger target pixels can expose target areas much faster for a given limited projector modulation rate. A projector may use a different shape of aperture, for examples rectangular for wiring layers, but circular for defining vias or contacts, for laying out vertically oriented capacitors, and for vertical transistor channels. A projector may use an aperture that projects an image smaller or larger than the width of track assigned to the channel, for different space-filling needs and displacement accuracy in the pattern drawn on the target.

The one or more structured light modulators (SLM) 808 of system 800 may be driven by the data pattern 802. In the illustrated example, electronic pattern controller 804 and/or SLM(s) 808 take the data stream or streams which specify the exposure of the pixels and modulate pulses of light to cause the pixels to be exposed. The modulator assembly 808 provides a separate modulated stream (pixel) for every distinct electron beam. One possible realization of modulator is an array of light emitting diodes (LEDs). These would enable very rapid rates of modulation for each pixel. Another possible realization is to use a Texas Instruments' "Digital Light Processor" (DLP™) device to modulate a light beam.

In some cases, more than one SLM 808 may be incorporated in a system, such as by running in parallel, modulating different sets of electron channels. For example, two or more SLMs and/or PEECAAs may be arranged to run in parallel to sweep twice the area in one pass over the target. In some cases, they may be optically coupled into the same path to take turns projecting onto the same set of electron channels with a faster data rate. For example, four SLMs 808 might be focused onto the same array of 2 million electron beams with each projector flashing briefly at a different time so that the overall rate of modulation is 4 times faster than any one projector is capable of. In this example, each SLM 808 would be exposing a set of locations on the target which represent sequential uses of the array of beams. The division of the data set, sending the correct pattern to each SLM 808, would assign the value for the target pixels in focus for the flash associated with that SLM 808 to be the values on that SLM 808 at that time. The next flash will have an array of values assigned to the SLM 808 which is paired with that flash. In this way the target locations as the transport moves them in front of the beam array are converted into the data stream of SLM pixel values, for one or more SLMs 808 which may be combined into driving the beam array. These data streams will be sent to the SLMs 808 by a control system including pattern storage and data transfer to the SLMs 808 to provide the data for each SLM 808 at the time the SLM 808 needs the data in order to have every pixel ready at the time that SLM 808 will flash the image. The control system may also provide the timing and sequencing for the flashes and synchronizes with the movement of the target on the target transport.

In some cases, the optics system may combine multiple separate SLMs 808 to focus upon the same set of designated pixels on the cathode, such that each SLM 808 may provide light for a brief time which takes turns to allow each SLM 808 to provide pixel values. For example, a DLP™ operating at 25 kHz may have its light source flashed for 1 microsecond, with 39 microseconds to prepare the device for its next set of pixel values. If there are 8 DLP devices 808 in the system they might operate for 1 microsecond each, offset by 4 microsecond gap until the next one, so that the combination of the 8 devices results in a 200 kHz projection rate. The response time of a photo-electric cathode is on the order of a nanosecond so there is plenty of opportunity to increase the combined projection rate and use shorter light pulses, thus increasing system throughput.

In some aspects, the system 800 may periodically or constantly monitor for failures. Optical methods are available for extensive monitoring of the SLM behavior, pattern accuracy, pixel fading, and positional feedback for target alignment and pattern delivery rate. An additional level of monitoring is possible using a specially engineered target which may include a reading head as a target that can monitor special patterns to detect and measure the current generated by every pixel. Such a measuring target may be used between regular targets to monitor correct operation. All of this data put together will be used to predict downtime and maintenance requirements, and to provide feedback for better manufacturing of future components.

Modern SLM systems have high reliability, but if one should develop a fault, the system 800 may continue to run with the remaining SLMs 808. For example, if one of the eight SLMs 808 in the previous description fails, then the remaining ones can each project every 7th frame of the pattern (instead of every 8th) with a 4.72 microsecond gap between and the target movement may be reduce to ⅞th of full speed in order to remain synchronized with the new 175 kHz rate. When the faulty SLM is repaired or replaced, the system can resume at full rate.

In some aspects, the system 800 may make use of the color sensitivity of photo electric emission by projecting in 2 different colors instead of simply off and on. One color may be selected to stimulate electron emission and that represent pixels which are on. The other color may be selected such that it is at a lower photon energy that cannot stimulate electron emission and is used for pixels which are off but delivers heat energy to the target. The purpose of the complementary color patterns is to maintain a uniform heating of all the pixels regardless of whether a pixel is on or off, as meticulous uniformity and stability is important in such precise systems. This arrangement is especially suitable for use with a DLP modulator because the micro mirrors of the DLP modulator take different positions angled from each other, such that two light sources with the same angular separation and different colors provide complementary light for off and for on.

In some cases, a narrow spectrum of light is preferred for the active color so that electrons liberated at the photocathode will have uniform energy. The color may be selected to have photon energy just slightly higher than the threshold energy which will liberate an electron. This minimal excess may ensure that the liberated electrons have minimal energy spread in unwanted directions, so that the electron optics can achieve an ideal focus. A narrow spectrum also allows the projector optics to be optimized without concern for chromatic aberration, thus allowing better performance on measures such as lack of distortion and ideally flat focal planes.

As illustrated, the optical path, including intermediate optics 816, intermediate optical assembly 818, and/or final objective optics 820, combines light from one or more SLM sources 808 and focuses and aligns it onto a grid pattern at the photoelectric cathode 822 where each grid point is closely aligned to the central path of a matching electron beam channel in the beam array. The optical path may include a strong and stable window between the chamber where the optical projectors are kept, and the vacuum chamber where the electron beams operate, such as described in more detail in reference to FIG. 1. The photoelectric cathode 822 may adjacent to the window and visible through it.

Each pixel's light is ideally concentrated at the center of the pixel. This allows the best separation of pixels (avoidance of crosstalk from light spilling into a neighbor). One implementation of pixel center concentration uses a "fly's-eye array" lens 818 with one convex focusing lenslet for every pixel. Lens 818 is placed in the optical path at an intermediate focal plane in the projector where it converts the light arriving broadly over the lens into a grid of points just beyond, each pixel concentrated by a matching lenslet. That set of focal points becomes the new source plane which will be imaged onto the photo-electric cathode 822, each point being aligned to be central to its' assigned channel in the grid which defines the entries to the electron lens array. In some cases, the fly's eye array may also be a location for an LCD or similar passive modulator of intensity at each pixel which can normalize the intensity of resulting electron beam to compensate for variations between the photocathode's pixels and changes over time and the photocathode ages.

In some aspects, the optical path may be accompanied by instruments which monitor the alignment and correct operation of the projected patterns. The instruments may include imaging of light scattered at various places in the optical pathway to monitor correct alignment. The light for individual pixels may be sampled for correctness and monitored for uniform intensity. This allows the quality of the generated image to be continuously assured and maintenance needs may be predicted for issues such as fading. The instruments may additionally or alternatively include measuring the correct positioning, sizing, and temperature of the photocathode 822 and electron beam elements visible through the window. Feedback from these instruments may be used to adjust or vary mechanical positioning and control temperatures within the projection system and within the electron beam array and its supporting system. The temperature control may support control of the assembly and element sizes and positions at the precision required. Other instruments may also be provided that see through and around the electron beam array to monitor the alignment and movement of the target relative to the beam array.

Once the light passes through the window separating the chambers it is focused upon the photo-emitter cathode which is generating electrons that will go into the array of electron beams. Electrons are emitted then in response to narrow spectrum light arriving from the back of the device with each pixel being a spot clearly separated from neighboring pixels and located as close as possible to the center of the corresponding column in the electron beam array.

In some aspects, the electron fields for lensing include the gap between the end of the channel and the target. The electrons may be further accelerated, or coast, or be decelerated from the end of the channel to the target. The most likely choice is a slight deceleration, as this field mirrors the orientation of fields in the beam channels. Any ion which would be accelerated toward the photocathode would first have to escape the attraction to return to the target. Oppositely charged ions or neutral particles are likely to be repelled from the beam channels or to drift towards high intensity gradients near the lens conductors. While these arrangements will minimize the transport of contaminants emanating from the target, one or more pellicles will remain the ultimate backstop to protect the photocathode surface from contamination.

The electron beams impinge upon a target where they will alter the composition, the structure, or the chemistry of the target surface. An example of compositional change would be the heat of the beam changing the allotrope structure of the surface of a material such as selenium. An example of a physical change would be evaporation of atomic layered film covering the target. An example of chemical change would be altering the chemical bonds in a resist such as HSQ (Hydrogen Silsesquioxane). To avoid build-up of static charge the target may need to be coated with a monolayer of something conductive, like silicon or aluminum, if the resist material is an insulator. The target may be cooled to reduce contamination emitted from the target by either normal evaporation or by bombardment from the electron beams.

Figure 9:
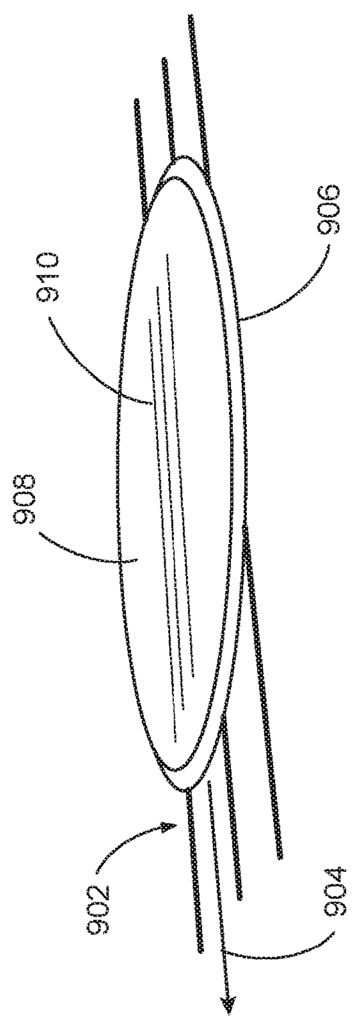
FIG. 9 illustrates an example diagram of target transport and movement, in accordance with at least one embodiment.

FIG. 9 illustrates an example diagram of target transport and movement system 900, in accordance with at least one embodiment. In some examples, system 900 may be used in conjunction with the PEECAA 200, electron beam channel array 400, 500, a number of electron beam channels 300, and/or a projection system 800 as described above, to form a lithographic system that addresses one or more of the problems with existing lithographic systems, as also described above.

In some cases, the data pattern is prepared in advance so that each beam is either generating electrons or not when the beam passes over a designated spot in the target 908. The beams are organized in an array pattern which scans the target 908 in a steady linear scan. The array may be very slightly rotated in a plane parallel to the target 908 so that every beam is centered on a different scan line, with enough array elements that the scan lines fill in the full area of the target 980 as it passes. This is a raster pattern of array projection.

In some uses the raster may deliberately be spaced wider than the size of the beam spots. For example if the goal is to produce a set of fins or wires at a standard spacing (a pattern which has become common with the most modern silicon chip designs) then the beams need cover only the area where lines need to be drawn. Gaps in the lines are produced by blanks in the modulation. The spaces between lines do not need exposure so the raster scan may speed up and deliver higher spot power by not assigning any beams to those spaces. A spot of the target which is exposed by one beam for one event either of electron exposure, or of no exposure, is a pixel on the target. The beams are pulsed for a fraction of the dwell time as the beam passes over the spot. This stroboscopic effect may reduce blurring of the pixels.

The target pixel modulation draws a raster pattern on the target. Each pixel can match with a beam and the time the beam is pulsed as it is aligned with that pixel. The data stream consists of the on or off values which will expose all the pixels at the correct time to draw the pattern. There are various ways this can be achieved. For example, at one extreme all the beams are synchronized and will flash simultaneously, so the data for that flash is organized as a single frame to be distributed to all beam sources prior to the synchronized flash, and after that the data for the next frame is loaded. At the other extreme each beam may be provided with a memorized sequence of all the bits it will draw, possibly at different moments in time than other beams, and an overall time standard (clock signal) may be distributed to the sources so they flash at the right time and advance to the next pixel each will draw. Which method is chosen will vary depending upon the optical source and modulation mechanism in use. For example, an SLM based upon DLP™ would likely use simultaneous flash, while a projector based upon an array of individually modulated laser or LEDs may work best with separate modulation streams for each array element.

In one example the pixels may be on the order of 10 nm squares, so a trillion bits of data form the pattern for one square centimeter of target area. If the target is exposed at 20 sq. mm per second then this would use about 200 gigabits per second of data and complete a square centimeter in approximately 5 seconds. Such large data rates are feasible with modern memory systems, high speed interconnects, and multiple combined light modulators.

The data pattern is not limited by the size of the beam array, so long as pattern memory is large enough. Practical memory systems can support patterns with hundreds of trillions of pixels. It is possible in principle for every square centimeter of the target to be written with a different pattern, such that the target may be one large device, or perhaps sub-divided into multiple different devices, as well as sub-divided into multiple identical devices. The next target may have yet another different pattern. Since there are no masks the system flexibility is only limited by the ability to design useful patterns.

When making patterns extend over large areas of the device, there are two different problems of extension. The target translates linearly in front of the array, so if the pattern data is supplied for long enough then the pattern may cross the whole target. If the pattern is wider than the array, then multiple passes will be needed and there is a problem of aligning the array to match a previous stripe. While alignment accurate to nanometers is desirable for other reasons, the stitching area between passes might be drawn with lower resolution features in order to reduce the chance of errors.

If the target is round, it is also possible to design special patterns which fill in the edge areas, where curves may limit the use of rectangles, where those patterns are not limited to rectangles. These might, for example, include projecting larger devices in the central area of the target while dividing the margins up into smaller devices which are produced on the same target.

As illustrated, the photocathode and electron beams may be held carefully and exactly stationary, so to transfer an area-filling result to a target 908. A grid of the electron beams may be projected onto the target 908 in a grid, as the target 908 is transported in a direction of movement 904 at a very slight angle to the grid. This angle is chosen so that beams shall trace different raster lines 910 on the target 908. It is possible for one, two, or more beams to be arranged to draw one raster, depending upon the tradeoffs of speed, resolution, and redundancy which are required. The raster lines 910 may be arranged to cover the entire plane of the target 908, or in some cases lines with intervening spaces may be preferred.

The guidance mechanism 902 may configured to be capable of providing precise, steady, linear translation in the direction of movement 904 so that the supporting base 906 shall exactly carry the beam target 908 smoothly sideways allowing the electron beams to draw raster lines 910 as the target passes underneath. In some cases, the transport or guidance mechanism 902 shall provide for exact height and temperature control of the target 908. It is important, in at least some aspects, that the transport be precise and smooth. Nanometer-scale registration to synchronize target position with the source beam modulation will make use of feedback. The feedback mechanism may include, for example, optical systems in the projection chamber that monitor registration markers on the target 908 and synchronize the source patterns to stay registered on the actual rate of progress of the target 908.

Figure 10:
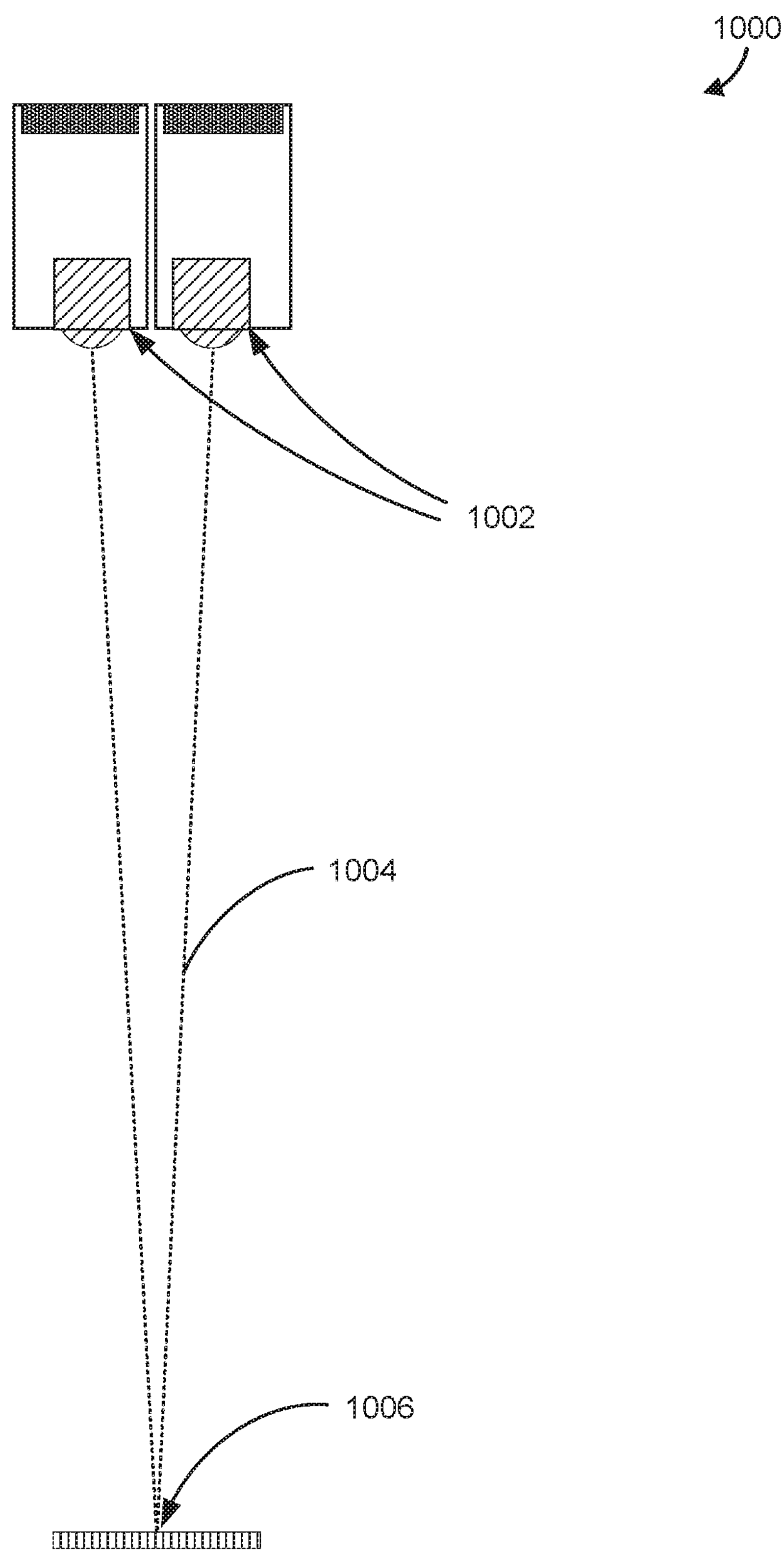
FIG. 10 illustrates an example of multiple simultaneous projections, in accordance with at least one embodiment.

FIG. 10 illustrates an example of multiple simultaneous projections 1000, in accordance with at least one embodiment. In some examples, projections 1000 and/or the arrangement and configuration of light sources 1002 may be generated and/or implemented by the projection system 800, as described above in reference to FIG. 8.

There are a huge number of circuit elements possible on a chip at the resolution feasible with electron lithography, such as provided by the systems and techniques described herein. For example, if the pattern is drawn with 10 nm squares, then there will be a trillion elements to be drawn for each square centimeter of target. Drawing a square cm per second would require a trillion pixel modulations per second. Some patterns, for example exposing alternating lines, may be drawn more efficiently with rasters that are not space filling, but in general the pixel modulation rate will be extraordinarily fast.

To address this increased speed capability of the described electron lithography system, two or more projectors 1002 can be arranged to share an optical path 1004, which focuses on the same target array. The method shown here is to use a tilt and shift modular projector, where a set of two projectors side by side, and another two in front of those, could be arranged to all project on the same intermediate optics (e.g., fly's eye intermediate optics) 1006. For example, if the pattern generation uses 4 projectors in alternation, it will load their SLM patterns then expose the pattern from each with flashes as each SLM is ready. The flashes are very brief to avoid blur due to the motion of the target, so the repetition interval will be long enough for many projectors to flash in their turn. In this example, the modulation rate is quadrupled due to the use of 4 projectors. Modern solid-state light sources can provide intense flashes at sub-microsecond duration and the photocathode response time is on the order of a nanosecond, so it is possible, using these described techniques, to raise the number of projectors to many more than 4. In some aspects, each projector may use 2 SLMs with crossed polarity of light for a total of 8 pattern sources.

Pixel patterns align, as illustrated on the fly's eye lens plane. All projectors may map to the same set of pixels, with each projector illuminated by a flash at a different time, so the sequence of flashes combines for a faster data rate at each pixel. This pixel plane will in turn be projected onto the photo-cathode so that each pixel here corresponds to a designated pixel position on the photo-cathode.

There are other constructs that may be modified using the described techniques for overlaying multiple optical sources to project onto a shared optical plane and pixel array. For example, polarized mirrors may combine two polarized sources (one transmitted, one reflected) onto a shared path, or multi-segmented tilted mosaics in an out-of-focus plane may combine multiple sources into the same path. All of these techniques may waste some power, but the intensity of optics required is easily obtained since each flash needs to be delivering just tens of milliwatts at the photocathode, while sources with watts of power are readily available.

Ultimately, the limit to modulation rate is likely to be set by the problems of maintaining target constant dimensions as the power intensity of beams on the target rises. Higher power may be used as target transport and mounting supports increased dimensional stability.

Figure 11:
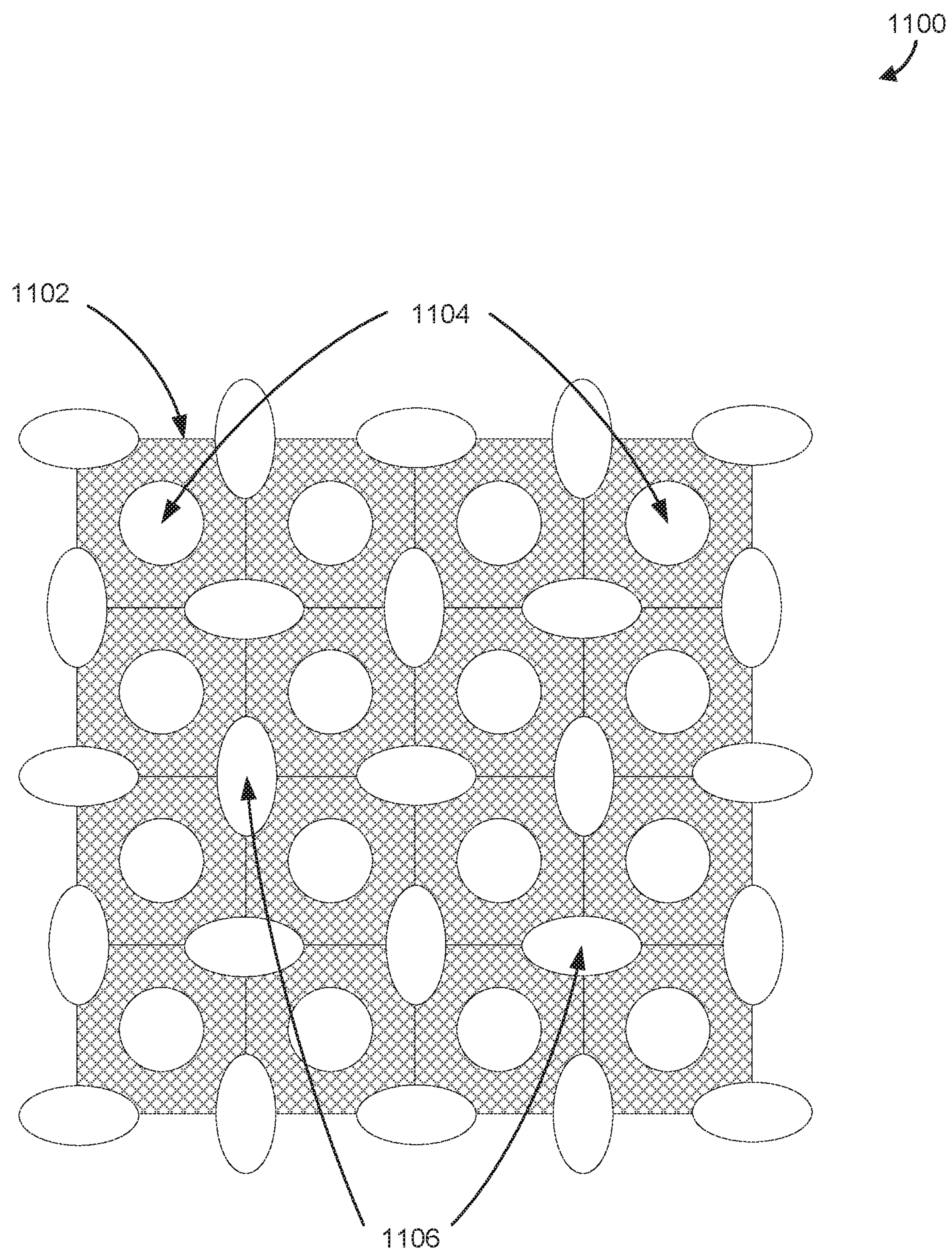
FIG. 11 illustrates an example of a stress release structure used to improve dimensional stability in a channel array subject to external forces, in accordance with at least one embodiment.

FIG. 11 illustrates an example of a channel array 1100, in accordance with at least one embodiment. Channel array 1100, in some examples, may be used in place of or be an example of channel array 220, and/or arrays 400 and 500, as described above in reference to FIGS. 2, 4, and 5.

The channel array 1000, in some cases, needs to be adjustable initially to match exact alignment in the machine, such as in PEECAA assembly 200, and then not to change size during operation. One way to achieve this is with a compliant grid held under tension by precisely located and stable assembly mounts, such as mounts 204, 206 as described above in reference to assembly 200. In one example, the grid may be compliant (slightly stretchy) without distorting the channels, so that the surrounding assembly can be designed to stay constant and hold the array under tension with constant size.

As illustrated, a pattern shows etching oval release voids 1106 into the array structure 1102, between the circular electron beam channels 1104. The voids 1106 alternate orientations so that varying the tension will produce a rotation on the channels, rather than distorting them. In practice, the tension will need to be minimal because any non-uniformity across the array could result in uneven stretching moving nanometers away from ideal locations.

Figure 12:
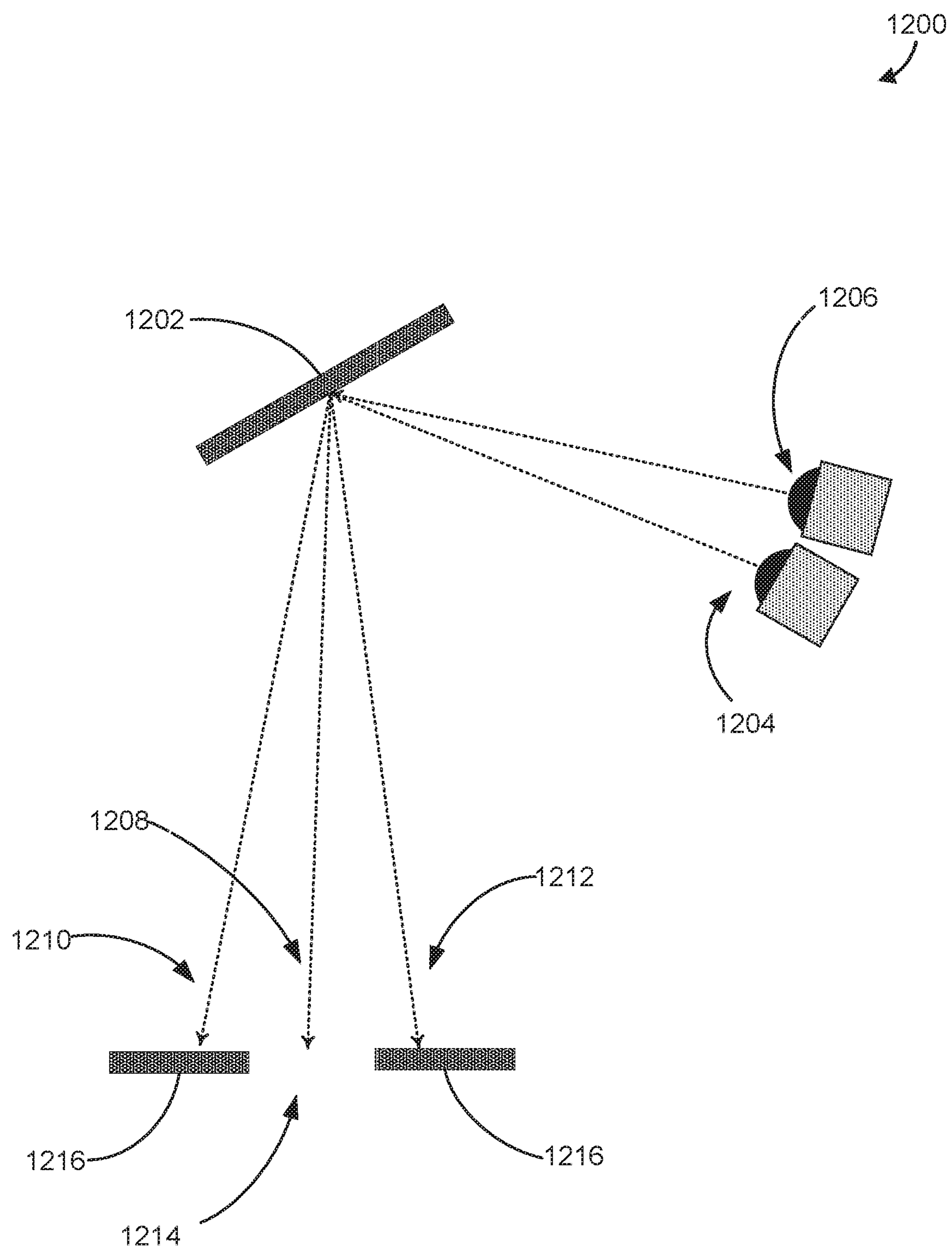
FIG. 12 illustrates an example an optical system utilizing titling pixel mirrors to provide constant power illumination, in accordance with at least one embodiment.

FIG. 12 illustrates an example an optical system 1200 utilizing mirrors to provide constant power illumination, in accordance with at least one embodiment. In some examples, optical system 1200 may be used in or form part of optical pattern generator and projector system 800, as described above in reference to FIG. 8. In yet some examples, system 1200 may be used in conjunction with the PEECAA 200, electron beam channel array 400, 500, a number of electron beam channels 300, and/or a projection system 800 as described above, to form a lithographic system that addresses one or more of the problems with existing lithographic systems, as also described above.

In some aspects, the use of a TI DLP 1202 or other mirror-tilt SLM offers an opportunity to provide constant-power illumination. Constant power illumination will equalize thermal power at every pixel in the photocathode and channel array, which may reduce or eliminates thermal expansion changes as the pattern changes.

The primary illumination 1204 may be set at a color with photon energy suitable for emitting electrons from the photocathode. A second illumination source 1206 may be set at a color which has a lower photon energy which will not cause electron emission. However, the second light source 1206 may flash at the same time as the primary source 1204, and the second source 1206 may be more powerful so that it delivers an energy similar not just to the primary source 1204 but also balancing out the energy and heating caused by electrons absorbed in the aperture barrier and channel array.

A mirror-tilt SLM works by switching a mirror element at each pixel between “on” and “off” angles. When the mirror element is in the on position, the primary beam follows the path 1208 to the exit 1214 of the projector. The secondary beam, which is offset from the primary by the same angle as between on and off tilts in the mirror, will in this case follow a path 1212 which is extinguished on a barrier 1216 in the projector.

Conversely, when the element mirror is in the “off” position the primary illumination follows a path 1210 to be extinguished at the projection stop 1216, but now the secondary light will follow the main path 1208 and exit the projector 1214. In this way, the photocathode is always illuminated when the lamps flash, but it may be with different color and intensity. In the “off” pixels, the photocathode will not emit electrons, because the photons do not carry enough energy, but the illumination will deliver enough energy to maintain constant heating.

In some aspects, the target may additionally be exposed to energy when it is not under the array, for example before or after travelling under the array, and also for parts of the target which pass beside the array, so that heating is uniform and close to constant, allowing thermal expansion to be minimized.

This arrangement may also be used for monitoring the correct operation of the projector. In some examples, an optical sensor may be used in the barrier positions 1216, to monitor which mirrors are in the "off" position and ensure this is changing in sync with the data pattern. Any discrepancy would indicate a fault in operation so that the equipment can be repaired. If any of the projectors has a fault, the equipment can continue to operate at reduced throughput until a repair has been effected. If there are N projectors then the data pattern can be adjusted to use (N−1) projectors, the target can move at (N−1)/N speed, and the flashes are equally timed in (N−1) rotation. Projector failures are expected to be rare but this approach can improve the operational efficiency until a replacement or repair is scheduled.

In some aspect, the described system and techniques may include one or more of the following features. It should be appreciated that various combinations of these features are completed herein, and that language indicating inclusion of a combination of features is not a requirement that those features operation in combination to provide one or more advantages as described herein.

1. In one example, a photo electron emitter and channel array assembly may include one or more of the following: a rear-illuminated photo-electron emitting cathode (photocathode); where an array of beam channels with electron optics is placed in front of the photocathode; where a pixelated pattern is projected from the rear of the cathode so that each pixel is aligned with a beam channel in front of the photocathode; where the photocathode is a rapidly replaceable element with a uniform surface such that the replacement will not change position or alignment of the electron beams which are generated. In some cases, a grid which is the first part of the beam channel array is moved into contact with the photocathode during operation, where the grid supports a barrier parallel to but separated from the cathode surface at a low positive voltage, where the barrier contains apertures allowing electrons to pass from the cathode into the beam columns beyond. In yet some cases, the array of beam columns adjacent to the barrier contains a beam column aligned accurately with each aperture, such that the aperture provides an exactly positioned source for electrons entering the column. In yet some cases, one or more of the beam columns contain an electron lens such that the electrons from the aperture will pass along the axis of the column and be focused by the lens. The columns may be packed densely and adjacently, with shared supporting walls acting as beam isolation, and the columns have shared lens layers with the same nominal geometry and operating voltages as each other. In some cases, there may be just one beam produced and focused in each column. In some aspects, the beams may be less than a millimeter length from aperture to lens exit, and/or the array of beams focuses at uniform distance after lens exit. In some cases, no per-column beam steering occurs after the electron lens. In some examples, the target is held parallel such that all beams focus substantially at the surface of a planar target. In some aspects, the entire assembly is operated in a high vacuum with mean path length longer than the distance from photocathode to target surface.

2. The elements of (1) where the electron emissive surface of the cathode is protected by a pellicle between the cathode and the channel array, said pellicle being capable of transmitting a large fraction of the electrons which pass through it at a low voltage compatible with the electron optics of the channel array 3. The elements of (2) where the pellicle is supported on the aperture barrier, maintaining the pellicle at a preferred distance and voltage relative to the cathode surface.

4. The elements of (1) where the beam array is engineered in an assembly such that the parts or the whole assembly may be removed and replaced with an exact equivalent, where the replacement may be easily and accurately positioned and aligned, have its size adjusted by means such as tension and temperature, to match exactly with the position, alignment, and size of other equivalent assemblies 5. The elements of (1), where the target moves in a steady uniform linear direction with planar surface coincident with the beams' focus at a small angle to the axis of the array of beams such that the beams will trace a raster pattern on the target surface.

6. The elements of (5), where the aperture may have a shape such as a circle, an ellipse, a square, or a rectangle, which is optimal for the projection of certain classes of pattern.

7. The elements of (1), the use of narrow spectrum light source with photon energy greater than the work function of the photocathode surface such that the photo-electrons will be emitted with limited small variations in energy that enable sharper focus and simpler column design.

8. The elements of (1), the use of a second color of light which has photon energy less than the work function of the photocathode surface so that electrons will not be emitted, said light being used to illuminate pixels not presently emitting electrons, such that the temperatures of the device will be more uniform regardless of the active pattern 9. The elements of (1), combined with the measurement of electron output at individual pixels at regular intervals over the period of use of the assembly, for example with a test target and test pattern capable of measuring pixel electron beam strength, so as to detect or schedule replacement of the photocathode, or the array assembly, or both.

10. The elements of (1), combined with the modulation of intensity of light delivered to each pixel based upon measurement of pixel electron output at regular intervals so as to maintain a uniform output from the array over all pixels and extend the reliable operation of the array even as pixel performance varies over time.

11. The elements of (1), combined with operating the photocathode at temperatures below 300 Kelvin which prolong the operating life and steady output of the photocathode.

12. The elements of (11), where a matching light source with the same band gap as the photocathode is operated at a temperature colder than the photocathode so that its photons will be emitted at shorter wavelength for efficient photo-emission.

13. The elements of (1) where the elements of the assembly such as the channel array include alignment features which may be measured or observed both in test and in production to establish the true and accurate position and orientation of the overall assembly and the elements within it.

14. The elements of (13) where accurate and reproducible manufacture is combined with characterization of an assembly's aggregate characteristics relative to alignment features built into the assembly so that when used in production, the production machinery may efficiently adapt for variations to ensure patterns will be projected at the precise target locations required.

15. The elements of (13) where the production environment includes a support system operating in the vacuum which allows the assembly to be inserted or removed then held and its position accurately adjusted to achieve the precise position and orientation of the array within the production machinery, where the actuators effecting these adjustments are under control of signals guided by measurement of the alignment features on the array.

16. The elements of (1) where the array of electron beam channels is manufactured using repeated layering of alternately refractory, insulating, resistive, or conducting materials uniformly across a planar device where the thicknesses of the layers are such that when an array of channels are, following a precise layout, etched or drilled vertical to the plane of the device through the layers the result will be that each channel has walls of alternating materials which, with the right voltages applied, shall act as the beam channel walls and electron optics capable of focusing a beam of electrons passing along or near to the axis of the channel.

17. The elements of (16), combined with multiple steps of layering and etching which may assist in obtaining a desired channel diameter profile which cannot be obtained with a single step of channel etching.

18. The elements of (16), combined with a step which patterns and etches one or more layers of a refractory material at or near to the point of entry to each channel, so as to form a restricted aperture of desired shape which is accurately and uniformly aligned with the axis of each channel.

19. The elements of (16) where a separately formed and patterned grid, barrier, aperture, and pellicle may be brought together with the beam channel array in precise alignment and attached while in use.

20. The elements of (1), combined with a structured light modulator which has two light sources of differing color, one with photon energy greater than or equal to the energy needed to release photo-electrons from the photocathode and the emitting photons which do not have sufficient energy to release photo-electrons, arranged that the higher energy photons will be delivered to pixels when the pixel should be active, while the lower energy photons will be delivered when the pixel is inactive, with the balance of energy such that the pixels will have roughly the same heat balance and equilibrium temperature regardless of the pattern being projected.

21. The elements of (20) where the two colors are provided to a single SCM using different angles or polarity, depending upon whether the modulation uses tilted mirrors or changing polarity, for each color so that the single modulator will deliver either one color or the other, for active and inactive pixels respectively.

22. The elements of (20) where the two colors are each projected by their separate SCM generating complementary patterns.

23. The elements of (1), where the target may be provided with temperature control outside of the area of the active patterning, such that the target has similar thermal inputs regardless of whether it is under the PEECAA receiving patterns, or outside, thus minimizing mechanical stress and size changes due to changing energy balance.

24. The elements of (1) where an array of per-pixel lenses (a fly's eye lens) is used at some point in the projection pathway to condense each pixel to a point focus at the center of the pixel.

25. The elements of (1) where an additional light modulator is used in each projector to change the light intensity of each pixel at the photocathode so that the average electron production will be uniform across the array and may be adjusted as electron emission efficiencies change during the operation of the photo-electric cathode.

26. The elements of (1) where multiple SLMs may be combined in the optical projector so that they align to the same set of pixels where the light source is flashed for each SLM in sequence resulting in higher rates of modulation of each pixel than each SLM can achieve by itself.

27. The elements of (26) where an array of pixel-sized lenses is used at some point in the projection pathway to condense each equivalent pixel from all SLMs and projectors to a point focus at the same place at the center of the pixel.

28. The elements of (26) with a controller which can partition the overall pattern to deliver the appropriate subset to each SLM and synchronize them to deliver interleaved pixels such that the original whole pattern of pixels is recreated on the target.

29. The elements of (26) with redundant operation such that a faulty SLM may be idled and the pattern repartitioned to be delivered by the remaining SLMs using a slower timing to continue operation until repair or replacement is possible.

30. The elements of (26) where each of the SLMs is in a separate, replaceable module, with substantially automated handling for speed and reliability.

31. The elements of (1), where a mechanism operating in the vacuum performs the mechanical process of removing all or parts of the photocathode and substrate to be placed where it can be unloaded for refurbishment or discarded, then taking a replacement assembly from a loading device and moving it within the vacuum chamber to insert into position for in the production machine, without compromising the quality of the vacuum. In some examples, the mechanism may include a rotating arm manipulator. A translation motion would extend the arm to grip the handles or holes in the side of the photocathode plate. The arm would then retract to extract the plate, and rotate to align with a staging area where the arm extends so the expired plate can be stacked within an airlock for later removal. The arm then retracts and rotates to a different staging area where fresh plates have been arranged through an airlock, extend and grip the next plate. Retract, rotate back to the PEECAA, extend to insert the fresh plate into the PEECAA, release grip and retract, rotate into a position which is clear of other operations such as target transport, and remain there until next needed. The adjustments within the PEECAA may provide loosening of the photocathode plate before the grip removes it, and when the fresh plate is inserted the PEECAA tightens the surrounds and adjusts the new plate to its correct position. The incoming airlock may also include bake-out and cleaning functions to ensure the incoming parts are decontaminated and have fresh surfaces, before being admitted to the functional vacuum chamber.

32. The elements of (4), where a mechanism operating in the vacuum performs the mechanical process of removing the electron beam channel array and its attached components to be placed where it can be unloaded for refurbishment or discard, then taking a replacement assembly from a loading device and moving it within the vacuum chamber to insert into position for in the production machine, without compromising the quality of the vacuum. This mechanism may be similar to the mechanism described above for removing and replacing a photocathode and substrate assembly, except that the translation for removing and inserting the PEECAA into its receptacle area mounted on the window may need to lift the assembly vertically off the receptacle rather than insert it sideways.

33. The elements of (5) where the relative rotation of the motion of the target and the geometry of the beam array is such that all beams taken together form an area filling raster upon the target.

34. The elements of (33) where the relative rotation is such that more than 1 beam may trace the same raster line, so that there is redundancy and higher power applied to each raster and each pixel.

35. The elements of (5) where the relative rotation of the motion of the target and the geometry of the beam array, as well as the focus spot size of the beams upon the target, is such that all beams taken together form a raster upon the target where there are unexposed spaces between the rasters so that linear patterns may be drawn faster.

36. The elements of (5) where the relative rotation is such that more than 1 beam may trace the same raster line, so that there is redundancy and higher power applied to each raster and each pixel.

37. The elements of (1) where the electrons are projected upon a target with chemistry sensitive to electrons in such a way as to form patterns of changed physics, structure, or chemistry in the target material, where the target chemistry or layers shall avoid charge buildup on the target, for example using conductive resist or an overcoating film which is conductive.

38. The elements of (1) where observation of the target and electron beam array, including the possible use of reference marks on the target, the array, and other parts of the machine, shall be used to guide the target support mechanism to hold the target in correct location for the rasters to align with the necessary locations on the target.

39. The elements of (1) where observation of the target and electron beam array, including the possible use of reference marks on the target, the array, and other parts of the machine, shall be used to pace the rate at which the pixel pattern is generated such that the correct value will be applied to the pixel at the moment when it modulates the electrons to be delivered to a corresponding location in the target.

40. The elements of (5) where distance sensing devices, such as capacitor or interferometric observations, shall be used to adjust the target support mechanism to hold the target at the correct distance from the electron beam channels for accurate focus.

41. The elements of (1) where the pattern may be of any size up to and including a distinct pattern for every part of a target.

42. The elements of (41) where reference marks permit multiple parallel passes of the electron beam array to be aligned accurately enough to stitch adjacent paths together in a single unbroken pattern.

43. The elements of (1) where the electrons impinge upon the target with less than 500 eV of energy.

44. The elements of (1) where careful measurement of photocathode selects for production use those which meet exacting uniformity standards, and characterizes variations within those limits with data supplied to production machines, so that position or intensity of pixels is substantially repeatable when a photocathode is replaced.

45. The elements of (4) where careful measurement of assemblies selects for production those which meet exacting alignment standards so that the final focus points upon the target will be exposed with repeatable alignment when assemblies are replaced.

Other variations are within the spirit of the present disclosure. Thus, while the disclosed techniques are susceptible to various modifications and alternative constructions, certain illustrated embodiments thereof are shown in the drawings and have been described above in detail. It should be understood however, that there is no intention to limit the invention to the specific form or forms disclosed but, on the contrary, the intention is to cover all modifications, alternative constructions, and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. Similarly, use of the term "or" is to be construed to mean "and/or" unless contradicted explicitly or by context. The terms "comprising," "having," "including," and "containing" are to be construed as open-ended terms (i.e., meaning "including, but not limited to,") unless otherwise noted. The term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal. The use of the phrase "based on," unless otherwise explicitly stated or clear from context, means "based at least in part on" and is not limited to "based solely on."

Conjunctive language, such as phrases of the form "at least one of A, B, and C," or "at least one of A, B and C," (i.e., the same phrase with or without the Oxford comma) unless specifically stated otherwise or otherwise clearly contradicted by context, is otherwise understood within the context as used in general to present that an item, term, etc., may be either A or B or C, any nonempty subset of the set of A and B and C, or any set not contradicted by context or otherwise excluded that contains at least one A, at least one B, or at least one C. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}, and, if not contradicted explicitly or by context, any set having {A}, {B}, and/or {C} as a subset (e.g., sets with multiple "A"). Thus, such conjunctive language is not generally intended to imply that certain embodiments require at least one of A, at least one of B and at least one of C each to be present. Similarly, phrases such as "at least one of A, B, or C" and "at least one of A, B or C" refer to the same as "at least one of A, B, and C" and "at least one of A, B and C" refer to any of the following sets:

{A}, {B}, {C}, {A, B}, {A, C}, {B, C}, {A, B, C}, unless differing meaning is explicitly stated or clear from context. In addition, unless otherwise noted or contradicted by context, the term "plurality" indicates a state of being plural (e.g., "a plurality of items" indicates multiple items). The number of items in a plurality is at least two but can be more when so indicated either explicitly or by context.

Operations of processes described herein can be performed in any suitable order unless otherwise indicated herein or otherwise clearly contradicted by context. In an embodiment, a process such as those processes described herein (or variations and/or combinations thereof) is performed under the control of one or more computer systems configured with executable instructions and is implemented as code (e.g., executable instructions, one or more computer programs or one or more applications) executing collectively on one or more processors, by hardware or combinations thereof. In an embodiment, the code is stored on a computer-readable storage medium, for example, in the form of a computer program comprising a plurality of instructions executable by one or more processors. In an embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In an embodiment, code (e.g., executable code or source code) is stored on a set of one or more non-transitory computer-readable storage media having stored thereon executable instructions that, when executed (i.e., as a result of being executed) by one or more processors of a computer system, cause the computer system to perform operations described herein. The set of non-transitory computer-readable storage media, in an embodiment, comprises multiple non-transitory computer-readable storage media, and one or more of individual non-transitory storage media of the multiple non-transitory computer-readable storage media lack all of the code while the multiple non-transitory computer-readable storage media collectively store all of the code. In an embodiment, the executable instructions are executed such that different instructions are executed by different processors—for example, in an embodiment, a non-transitory computer-readable storage medium stores instructions and a main CPU executes some of the instructions while a graphics processor unit executes other instructions. In another embodiment, different components of a computer system have separate processors and different processors execute different subsets of the instructions.

Accordingly, in an embodiment, computer systems are configured to implement one or more services that singly or collectively perform operations of processes described herein, and such computer systems are configured with applicable hardware and/or software that enable the performance of the operations. Further, a computer system, in an embodiment of the present disclosure, is a single device and, in another embodiment, is a distributed computer system comprising multiple devices that operate differently such that the distributed computer system performs the operations described herein and such that a single device does not perform all operations.

The use of any and all examples or exemplary language (e.g., "such as") provided herein is intended merely to better illuminate embodiments of the invention and does not pose a limitation on the scope of the invention unless otherwise claimed. No language in the specification should be construed as indicating any non-claimed element as essential to the practice of the invention.

Embodiments of this disclosure are described herein, including the best mode known to the inventors for carrying out the invention. Variations of those embodiments may become apparent to those of ordinary skill in the art upon reading the foregoing description. The inventors expect skilled artisans to employ such variations as appropriate, and the inventors intend for embodiments of the present disclosure to be practiced otherwise than as specifically described herein. Accordingly, the scope of the present disclosure includes all modifications and equivalents of the subject matter recited in the claims appended hereto as permitted by applicable law. Moreover, any combination of the above-described elements in all possible variations thereof is encompassed by the scope of the present disclosure unless otherwise indicated herein or otherwise clearly contradicted by context.

All references including publications, patent applications, and patents cited herein are hereby incorporated by reference to the same extent as if each reference were individually and specifically indicated to be incorporated by reference and were set forth in its entirety herein.

What is claimed is:

1. A photo electron emitter and channel array assembly comprising:

a rear-illuminated photo-electron emitting cathode having a uniform planar cathode surface; and an array of beam channels proximate to the cathode surface of the rear-illuminated photo-electron emitting cathode, wherein at least one of the rear-illuminated photo-electron emitting cathode or the array of beam channels is removable from the photo electron emitter and channel array assembly, the array of beam channels comprising:

a grid of apertures;

a plurality of beam channels; and a shared lens array comprising a plurality of lenses proximate to an exit of the plurality of beam channels, wherein individual apertures of the grid of apertures align with individual beam channels of the beam channel array to allow electrons from the rear-illuminated photo-electron emitting cathode to pass through the array of beam channels and the shared lens to form a pixelated pattern, wherein, upon exposure to a target, the pixelated pattern is permanently formed on the target.

2. The photo electron emitter and channel array assembly of claim 1, wherein individual beam channels of the plurality of beam channels and individual lenses of the plurality of lenses are precisely aligned with the individual apertures to provide an exactly positioned source for electrons entering the individual beam channels.

3. The photo electron emitter and channel array assembly of claim 1, wherein the grid of apertures is formed through a barrier parallel to but separated from the cathode surface, wherein the barrier has a low positive voltage.

4. The photo electron emitter and channel array assembly of claim 1, wherein the individual beam channels of the plurality of beam channels are formed adjacent to each other sharing supporting walls.

5. The photo electron emitter and channel array assembly of claim 4, wherein the supporting walls comprise at least two layers, wherein each of the at least two layers have a same nominal geometry and a same operating voltage.

6. The photo electron emitter and channel array assembly of claim 1, wherein each of the plurality of beam channels comprises an electron lens, wherein electrons from the individual apertures pass through the beam channel and are focused by the electron lens.

7. The photo electron emitter and channel array assembly of claim 1, wherein the photo electron emitter and channel array assembly is operated in a high vacuum having a mean path length longer than a distance from the rear-illuminated photo-electron emitting cathode to the target.

8. The photo electron emitter and channel array assembly of claim 1, wherein the rear-illuminated photo-electron emitting cathode contacts the grid of apertures during operation.

9. The photo electron emitter and channel array assembly of claim 1, further comprising a pellicle spanning at least a portion of the array of beam channels, wherein the pellicle allows transmission of low voltage electrons.

10. The photo electron emitter and channel array assembly of claim 9, wherein the pellicle is supported on the grid of apertures, maintaining the pellicle at a distance and a voltage relative to the cathode surface.

11. The photo electron emitter and channel array assembly of claim 1, further comprising an alignment mechanism connected to the array of beam channels, wherein the alignment mechanism applies tension to the array of beam channels to align in at least one of position or temperature the array of beam channels with the rear-illuminated photo-electron emitting cathode.

12. The photo electron emitter and channel array assembly of claim 1, wherein individual apertures of the grid of apertures comprise an aperture shape, the aperture shape including one of a circle, an ellipse, a square, or a rectangle, and wherein the aperture shape is selected based on the pixelated pattern.

13. The photo electron emitter and channel array assembly of claim 1, wherein the array of electron beam channels is formed using a plurality of layers of alternately refractory, insulating, resistive, or conducting materials.

14. The photo electron emitter and channel array assembly of claim 13, wherein the plurality of layers, upon application of a voltage, focus electrons passing through individual of the plurality of beam channels.

15. The photo electron emitter and channel array assembly of claim 13, wherein individual apertures of the grid of apertures are formed by one or more layers of a refractory material at or near to the point of entry of individual beam channels of the plurality of beam channels.

16. A lithographic system, comprising:

a modulated light source;

a vacuum chamber;

a transparent planar window optically coupling an output of the modulated light source and the vacuum chamber; and a photo electron emitter and channel array assembly removably attached to the transparent window and contained within the vacuum chamber, wherein the photo electron emitter and channel array assembly comprises:

a photocathode; and an array of beam channels proximate to the photocathode, wherein upon exposer to light from the modulated light source, the photocathode generates electron beams that are directed through individual beam channels of the array of beam channels to form a pixelated pattern on a target movably located within the vacuum chamber.

17. The system of claim 16, further comprising an alignment mechanism coupled to at least one of the vacuum chamber, the transparent planar window, or the photo electron emitter and channel array assembly that aligns the photo electron emitter and channel array assembly, the photocathode, the array of beam channels, and the modulated light source to enable the pattern to be formed on the target.

18. The system of claim 17, wherein the alignment mechanism comprises at least one of reference markings or physical limiters on at least two of the transparent planar window, the photo electron emitter and channel array assembly, the photocathode, and the array of beam channels.

19. The system of claim 16, further comprising a target guidance mechanism that movably positions the target parallel to the photo electron emitter and channel array assembly such that beams output by the array of beam channels focus substantially at a surface of the target.

20. The system of claim 19, wherein the target guidance mechanism moves the target in a uniform linear direction at a small angle to an axis of the beams output by the array of beam channels such that the beams trace a raster pattern on the target.

21. The system of claim 16, wherein the modulated light source comprises a narrow spectrum light source with a photon energy greater than a work function of the photocathode.

22. The system of claim 16, wherein the modulated light source produces a first color output and a second color output, wherein the first color output has a photon energy greater than or equal to the energy needed to release photoelectrons from the photocathode, wherein the second color output has a photon energy less the energy needed to release photo-electrons from the photocathode, and wherein the first color output and the second color output maintain a substantially uniform temperature across the target.

23. The system of claim 16, further comprising a feedback mechanism, wherein the feedback mechanism detects and compares an electron output levels of individual pixels of the pixelated pattern to at least one threshold to determine if at least one of the photo electron emitter and channel array assembly or the photocathode needs replacement.

24. The system of claim 16, wherein the modulated light source comprises a single spatial light modulator using different angles or polarity to provide a first light output and a different second light output.

25. The system of claim 16, wherein the modulated light source comprises two spatial light modulators to provide a first light output and a different second light output.

26. The system of claim 16, wherein the modulated light source comprises a plurality of spatial light modulators, wherein the plurality of spatial light modulators are directed at least a first group of pixels of the pixelated pattern, and wherein the plurality of spatial light modulators are activated at different points in time to produce an increased modulate rate for at least the first group of pixels.

* * * * *